(12) United States Patent
Stammer et al.

(10) Patent No.: US 12,031,780 B2
(45) Date of Patent: Jul. 9, 2024

(54) LIQUID MANIFOLD FOR ELECTRONICS CABINET

(71) Applicant: Hoffman Enclosures Inc., Anoka, MN (US)

(72) Inventors: Scott Stammer, Champlin, MN (US); Allen DeMars, Elk River, MN (US)

(73) Assignee: Hoffman Enclosures Inc., Anoka, MN (US)

( * ) Notice: Subject to any disclaimer, the term of this patent is extended or adjusted under 35 U.S.C. 154(b) by 0 days.

(21) Appl. No.: 17/885,697

(22) Filed: Aug. 11, 2022

(65) Prior Publication Data
US 2023/0052671 A1 Feb. 16, 2023

Related U.S. Application Data

(60) Provisional application No. 63/232,035, filed on Aug. 11, 2021.

(51) Int. Cl.
*F28F 9/02* (2006.01)
(52) U.S. Cl.
CPC .................. *F28F 9/0256* (2013.01)
(58) Field of Classification Search
CPC .. F28F 9/0256; F28F 9/0246; Y10T 29/49948
USPC ........................................................ 165/178
See application file for complete search history.

(56) References Cited

U.S. PATENT DOCUMENTS

| | | | |
|---|---|---|---|
| 4,782,852 A | 11/1988 | Legris | |
| 6,840,758 B2 * | 1/2005 | Babin | B29C 45/2806 |
| | | | 264/328.9 |
| 6,958,911 B2 | 10/2005 | Cader et al. | |
| 7,042,726 B2 | 5/2006 | Cader et al. | |
| 7,849,575 B2 * | 12/2010 | Hume | B25B 27/0028 |
| | | | 29/263 |
| 8,035,972 B2 | 10/2011 | Ostwald et al. | |
| 8,231,145 B2 | 7/2012 | Blivet et al. | |
| 8,456,833 B2 | 6/2013 | Eagle | |
| 8,654,532 B2 | 2/2014 | Chen et al. | |
| 8,854,808 B2 | 10/2014 | Mullady | |
| 8,865,048 B2 * | 10/2014 | Ciccone | B29C 45/27 |
| | | | 425/549 |
| 8,867,205 B2 | 10/2014 | Eagle | |
| 9,016,314 B2 | 4/2015 | Eriksen et al. | |

(Continued)

FOREIGN PATENT DOCUMENTS

| | | |
|---|---|---|
| CN | 109237172 A | 1/2019 |
| CN | 109699159 A | 4/2019 |

(Continued)

*Primary Examiner* — Jon T. Schermerhorn, Jr.
(74) *Attorney, Agent, or Firm* — Quarles & Brady LLP

(57) ABSTRACT

A manifold assembly provided for a server rack. The manifold assembly can include a manifold tube with a port hole within a spotface that extends inward from an external surface of the manifold tube. A channel can be included having a channel aperture. A bushing can also be included with a throughbore extending along a bushing axis. The bushing can be coupled to the channel with the bushing axis in alignment with a center of the channel aperture. The channel can be rigidly secured to the manifold tube to provide structural support thereto relative to the server rack, with the bushing captivated between the channel and the manifold tube and the bushing received within the spotface.

20 Claims, 19 Drawing Sheets

(56) References Cited

U.S. PATENT DOCUMENTS

| | | |
|---|---|---|
| 9,161,477 B2 | 10/2015 | Demange et al. |
| 9,298,231 B2 | 3/2016 | Arvelo et al. |
| 9,351,428 B2 | 5/2016 | Eckberg et al. |
| 9,354,676 B2 | 5/2016 | Shelnutt et al. |
| 9,497,888 B2 | 11/2016 | Arvelo et al. |
| 9,655,281 B2 | 5/2017 | Harvilchuck et al. |
| 9,803,783 B2 | 10/2017 | Zulauf et al. |
| 9,848,514 B2 | 12/2017 | Shelnutt et al. |
| 9,854,713 B2 | 12/2017 | Krug, Jr. et al. |
| 9,861,012 B2 | 1/2018 | Krug, Jr. et al. |
| 9,861,013 B2 | 1/2018 | Edwards et al. |
| 9,918,409 B2 | 3/2018 | Edwards et al. |
| 9,939,090 B2 | 4/2018 | Gilbreath |
| 10,168,110 B2 | 1/2019 | Krug, Jr. et al. |
| 10,174,873 B2 | 1/2019 | Gilbreath |
| 10,178,801 B2 | 1/2019 | Liu et al. |
| 10,188,016 B2 | 1/2019 | Lunsman et al. |
| 10,251,318 B2 | 4/2019 | Krug, Jr. et al. |
| 10,271,464 B2 | 4/2019 | Krug, Jr. et al. |
| 10,288,198 B2 | 5/2019 | Tiberghien et al. |
| 10,299,413 B2 * | 5/2019 | Cui .................. H05K 7/1487 |
| 10,327,358 B2 | 6/2019 | Harvilchuck et al. |
| 10,660,239 B2 | 5/2020 | Edwards et al. |
| 10,701,838 B1 | 6/2020 | Conroy et al. |
| 10,718,554 B2 | 7/2020 | Hirai et al. |
| 10,791,654 B2 | 9/2020 | McCordic et al. |
| 10,827,648 B2 | 11/2020 | Liu et al. |
| 10,837,719 B2 | 11/2020 | Franz et al. |
| 10,863,652 B1 | 12/2020 | Conroy et al. |
| 10,921,070 B2 | 2/2021 | Chen et al. |
| 10,939,589 B2 | 3/2021 | Krug, Jr. et al. |
| 10,952,354 B1 | 3/2021 | Chen et al. |
| 11,039,552 B2 | 6/2021 | Krug, Jr. et al. |
| 11,064,628 B2 * | 7/2021 | Thibaut ............. H05K 7/20772 |
| 11,083,110 B2 | 8/2021 | Krug, Jr. et al. |
| 11,096,315 B2 | 8/2021 | Krug, Jr. et al. |
| 11,197,393 B2 | 12/2021 | Harvilchuck et al. |
| 11,212,943 B2 | 12/2021 | Heydari |
| 11,432,435 B2 * | 8/2022 | Kaiser ..................... F16K 27/00 |
| 2008/0093054 A1 | 4/2008 | Tilton et al. |
| 2010/0000721 A1 | 1/2010 | Lai |
| 2010/0108300 A1 | 5/2010 | Hoehne |
| 2015/0077930 A1 * | 3/2015 | Kadotani ........... H05K 7/20781 |
| | | 361/679.53 |
| 2016/0270260 A1 | 9/2016 | Franz |
| 2016/0356559 A1 | 12/2016 | Krug, Jr. et al. |
| 2019/0182989 A1 | 6/2019 | Chen et al. |
| 2021/0267095 A1 | 8/2021 | Heydari |
| 2021/0267096 A1 | 8/2021 | Heydari |
| 2022/0141999 A1 | 5/2022 | Ge et al. |
| 2022/0325838 A1 | 10/2022 | Manzato |

FOREIGN PATENT DOCUMENTS

| | | |
|---|---|---|
| CN | 208724302 U | 4/2019 |
| CN | 109392294 B | 9/2020 |
| CN | 108194721 B | 10/2020 |
| CN | 112218492 A | 1/2021 |
| CN | 109296861 B | 2/2021 |
| DE | 19603398 B4 | 4/2005 |
| WO | 2021/170103 A1 | 9/2021 |

* cited by examiner

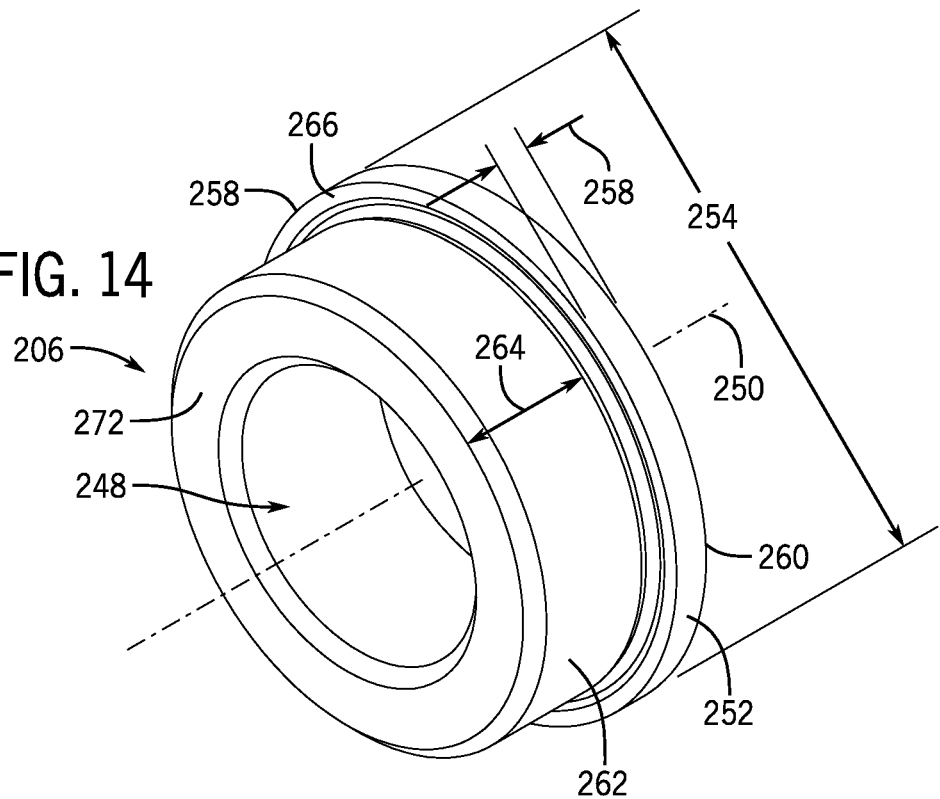
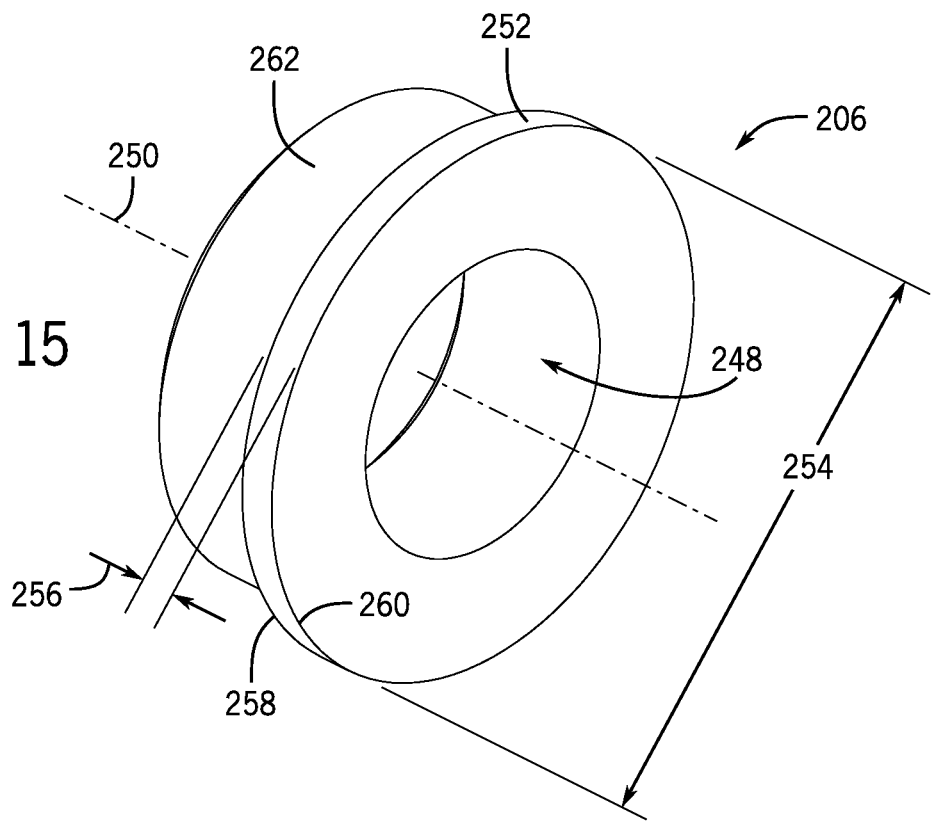

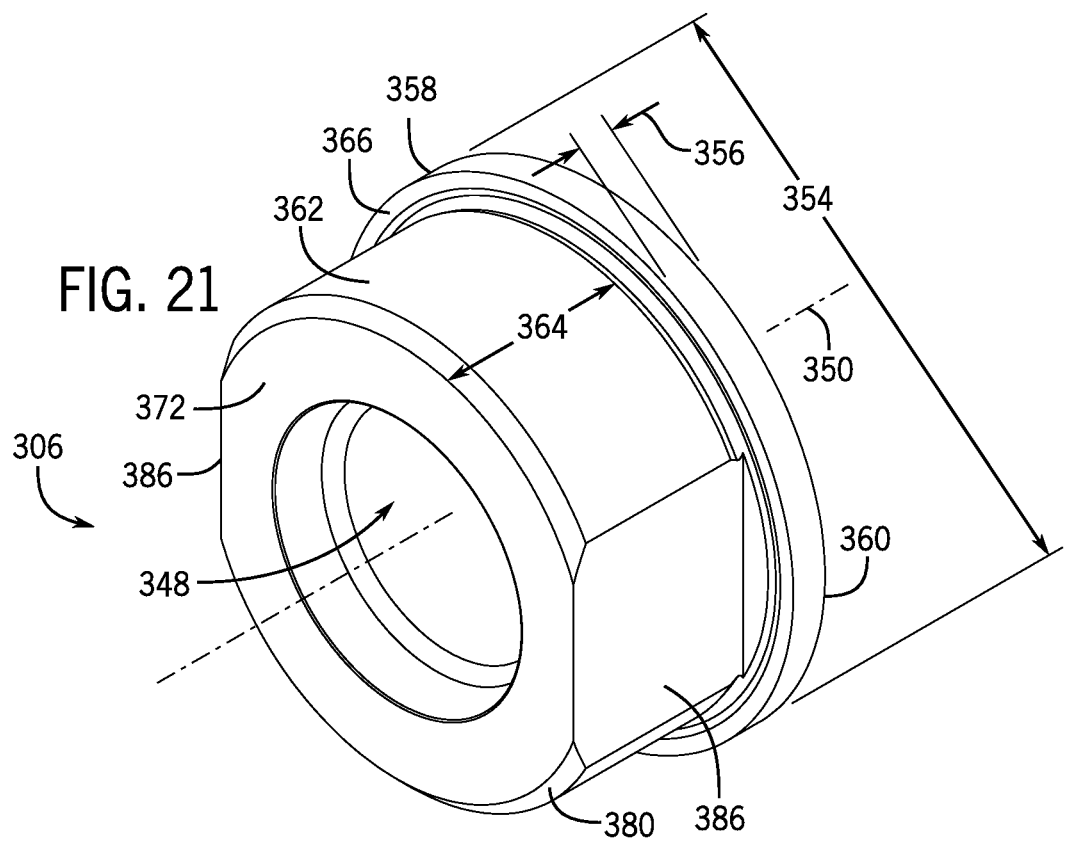
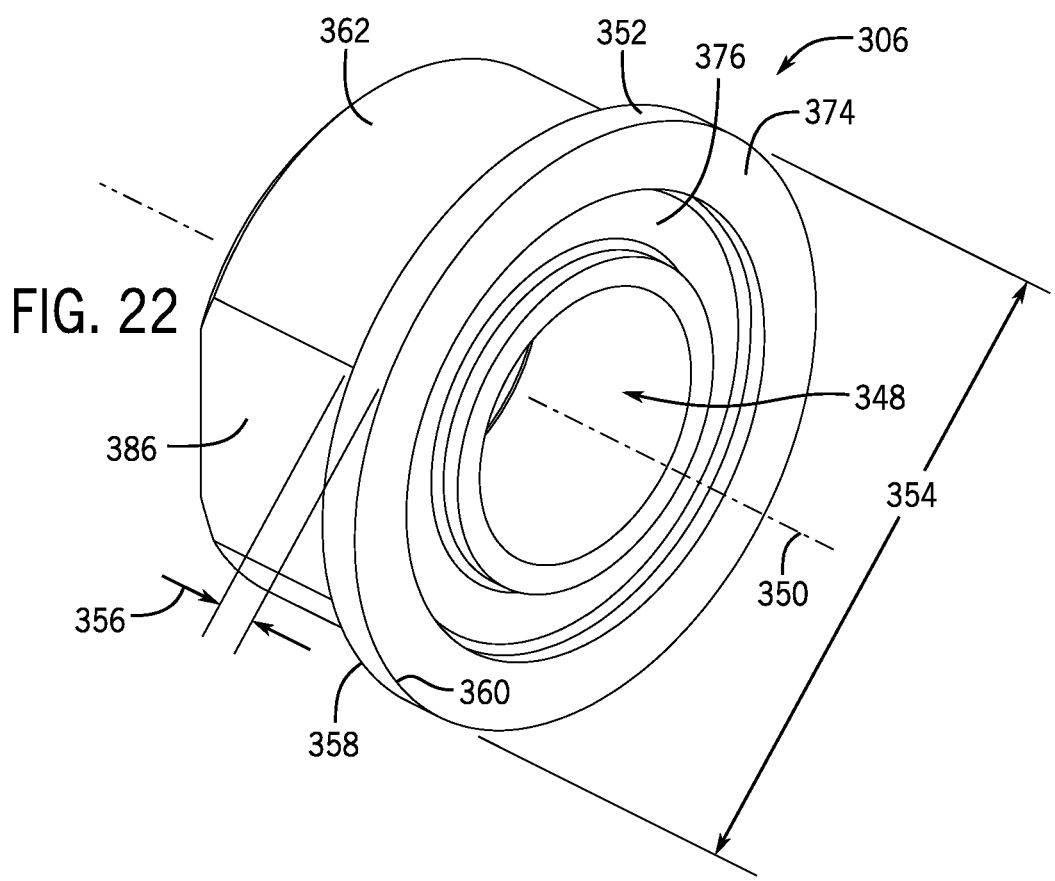

LIQUID MANIFOLD FOR ELECTRONICS CABINET

CROSS-REFERENCE TO RELATED APPLICATIONS

This application claims priority to U.S. Provisional Patent Application No. 63/232,035, filed Aug. 11, 2021, titled "Liquid Manifold for Electronics Cabinet," the entirety of which is incorporated herein by reference.

BACKGROUND

In some cooling system applications, a manifold may deliver flows of cooling fluid to and from electronics supported on a rack within a cabinet or stack. For example, some liquid cooling systems can include manifolds that allow pumped fluid to individually cool multiple server trays that are stacked vertically within a server rack or other arrangement. In such systems, avoiding leakage of cooling fluid in the vicinity of the electronics that are to be cooled may be important.

SUMMARY

Some embodiments of the invention provide a manifold assembly for a server rack. The manifold assembly can include a manifold tube with a port hole within a spotface that extends inward from an external surface of the manifold tube. A channel can be included having a channel aperture. A bushing can also be included with a throughbore extending along a bushing axis. The bushing can be coupled to the channel with the bushing axis in alignment with a center of the channel aperture. The channel can be rigidly secured to the manifold tube to provide structural support thereto relative to the server rack, with the bushing captivated between the channel and the manifold tube and the bushing received within the spotface.

Some embodiments of the invention can provide a manifold assembly for a server rack, wherein the manifold assembly can include a manifold tube with a first manifold wall, a second manifold wall, and a third manifold wall. The first manifold wall can have a plurality of port holes for flow of a coolant fluid. A channel can also be included with a first channel wall, a second channel wall, and a third channel wall. The first channel wall can extend between the second and third channel walls and can have a plurality of channel apertures. A plurality of bushings, each with a throughbore defining a bushing axis, can be fixedly coupled to the first channel wall with the bushing axes axially aligned with the respective channel apertures to provide respective flow paths for the coolant into or out of the port holes of the manifold tube. The second and third channel walls can be secured to the second and third manifold walls, respectively, at locations adjacent each of the plurality of port holes to rigidly secure the channel to the manifold tube.

Some embodiments of the invention can provide a manifold assembly for a server rack, wherein the manifold assembly can include a manifold tube with a locating feature formed within a wall thereof. The manifold tube can extend a manifold length in an elongate direction and can include a port hole for coolant flow. A rigid channel can be secured to the manifold tube along the elongate direction to stiffen the manifold tube. A bushing, configured to receive a quick-connect coupling, can be rigidly secured to the channel and positioned within the locating feature on the wall of the manifold tube to align the bushing with the port hole of the manifold tube.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 14 is a top front right isometric view of a bushing of the manifold assembly of FIG. 9 according to an embodiment of the invention;

FIG. 15 is a top rear right isometric view of the bushing of FIG. 14;

FIG. 21 is a top front right isometric view of a bushing of the manifold assembly of FIG. 16 according to an embodiment of the invention; and FIG. 22 is a top rear right isometric view of the bushing of FIG. 21.

DETAILED DESCRIPTION

Figure 1:
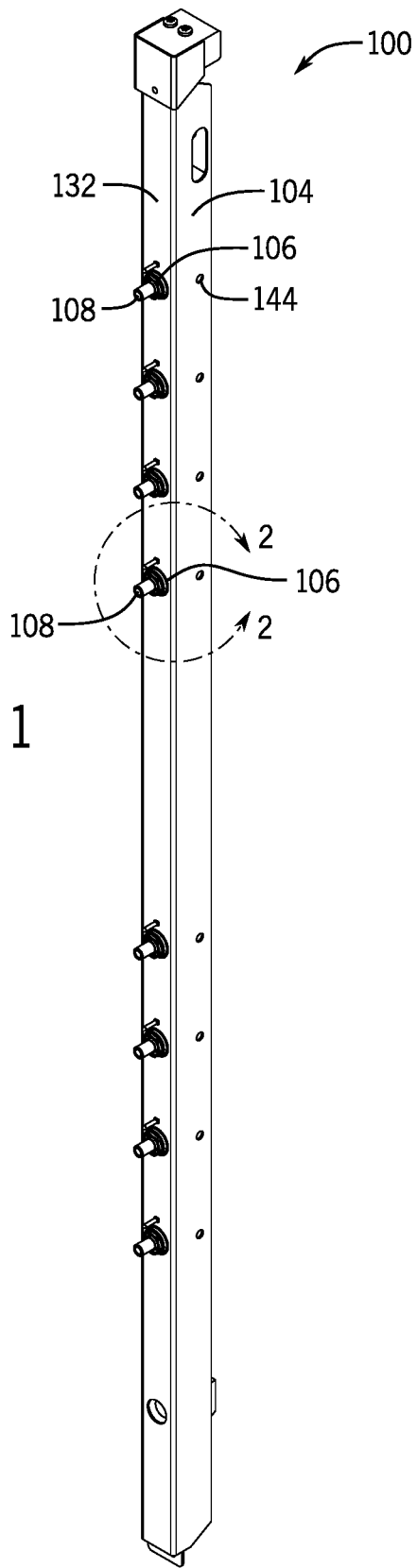
FIG. 1 is a top front right isometric view of a manifold assembly according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Some of the discussion below describes interfaces that can be used to help provide liquid cooling to server racks. The context and particulars of this discussion are presented as examples only. For example, embodiments of the disclosed invention can be used in other contexts, such as for cooling computing equipment other than servers, or various other electronics, configured in various ways, including with other shapes and arrangements of elements.

When liquid flows are used to cool electronics, it may be useful to allow for quick, blind connection of flow paths in assemblies to be cooled and flow paths within manifolds that provide the cooling flows. For example, a server or other electronics assembly can be configured to be readily (e.g., partly automatically) aligned for connection to a flow system for liquid cooling of server racks as the assembly is moved into position for operation. This may allow operators to ensure secure attachment of fluid couplings without manual engagement of the couplings or particular attention to alignment of the various components during installation.

Conventional arrangements for liquid cooling can include manifolds for fluid delivery that are equipped with quick-connect fluid couplings. With these types of fluid couplings, blind connections with reliably leak proof operation can be obtained, provided that opposing sides of the couplings (e.g., on a manifold and on a server assembly) are appropriately aligned.

However, conventional approaches for construction of server racks and cooling manifolds may result in substantial variations in relevant dimensions, which can have substantial detrimental effects on alignment between associated components. For example, many conventional systems use manifolds and electronics racks that are manufactured from formed (e.g., bent and stamped or laser cut) sheet metal. Further, threaded ports for attaching the quick-connect coupling can be formed by welding a threaded port to the manifold, by tapping a thickwall manifold tube, or by tapping a port formed in the manifold through friction drilling. These methods can create distortion or shrinkage of the manifold tube. These and other systems can exhibit substantial dimensional variances and can create stacked tolerance issues as a potentially unavoidable consequence of these manufacturing techniques. Accordingly, for example, it may be difficult in conventional systems to ensure appropriate alignment and, correspondingly, fluid connection, between opposing sides of fluid couplings. This may be problematic due to the effects of exposing electronics to certain liquids (e.g., water). And, even if leaks are avoided, failure to appropriately secure couplings for fluid transfer can result in poor performance of the relevant electronics, including decreased rates of heat transfer due to a lack of adequate flow of cooling fluid.

Considerations beyond dimensional variation can also complicate the task of making secure and predictable connections at fluid couplings for liquid cooling. For example, pressure of fluid flow at fluid couplings can tend to urge the couplings to separate, with corresponding forces on associated manifolds and electronics racks. Additionally, many quick-connect couplings utilize spring-loaded components. The forces of the springs can also impose substantial forces on manifolds and electronics racks, particularly for non-locking connections in which spring forces may not be absorbed by locking devices during system operation. In this regard, for example, some manifolds may be subject to lateral loading of 800 pounds or more during operation. Such loading can also create (or exacerbate) problems with misalignment of components, including for manifolds that may be secured to larger support structures only at limited connection points.

Embodiments of the invention can address these or other issues by helping to ensure appropriately aligned engagement between liquid ports on cooling manifolds and on electronics assemblies. For example, in some embodiments, components of a manifold assembly can be configured to be located quickly and accurately within the assembly. A bushing, configured to receive a quick-connect coupling, can be shaped and sized to be received within a structural member (e.g., a channel) on one end and a manifold tube on the other end. For example, the bushing can have physical elements that align and locate the bushing within the channel and the manifold tube can have physical elements that align and locate the bushing with a port hole in the manifold tubing. In some embodiments, the channel can be secured to the manifold tube at predetermined locations to prevent warping and deformation of the manifold assembly. Additionally, by securing the channel to the manifold tube, deflection of the manifold tube due to reaction forces within the fluid distribution system can be reduced. Reducing the forces imparted on the manifold tube can allow for the use of lighter gauge manifold tube materials that can reduce the cost of manufacturing.

As used herein, unless otherwise limited, a "fluid port" means any feature that provides a transition into or out of a particular system along a fluid particular flow path. Thus, for example, a fluid port can include simple openings in structures that are configured for fluid flow, or more complex mechanisms such as fluid couplings (e.g., a quick-connect coupling).

In some cases, a structural support (e.g., a channel) can be configured to substantially envelop a manifold tube and be secured thereto at locations on opposite walls adjacent fluid ports (e.g., by welding and/or mechanical fasteners). In some embodiments, the locations of the securements between the channel and the manifold tube are in alignment with the respective neighboring fluid ports. In other words, the centers of the securement locations and the centers of the fluid ports lie along a single plane extending through the manifold tube perpendicular to the length dimension thereof. In some embodiments, the centers of the securement locations can be located near the respective fluid port, within 15 percent or less of the distance between the center of the respective fluid port and the nearest adjacent fluid port. This can reduce deformation of the manifold tube and can add targeted areas of strength within a manifold assembly where internal and external forces may most likely be experienced.

In some embodiments, bushings configured to receive a quick-connect coupling can be secured to a structural support (e.g., a channel) and configured to be received within a locating feature on a manifold tube to ensure accurate alignment of the bushing with the manifold tube when the channel is secured to the manifold tube. In some embodiments, the bushing only superficially makes contact with the manifold tube during assembly. Superficial contact, or superficial engagement, as used herein, can mean making contact at a surface-to-surface interface without securement of the contact at the interface.

Figure 3:
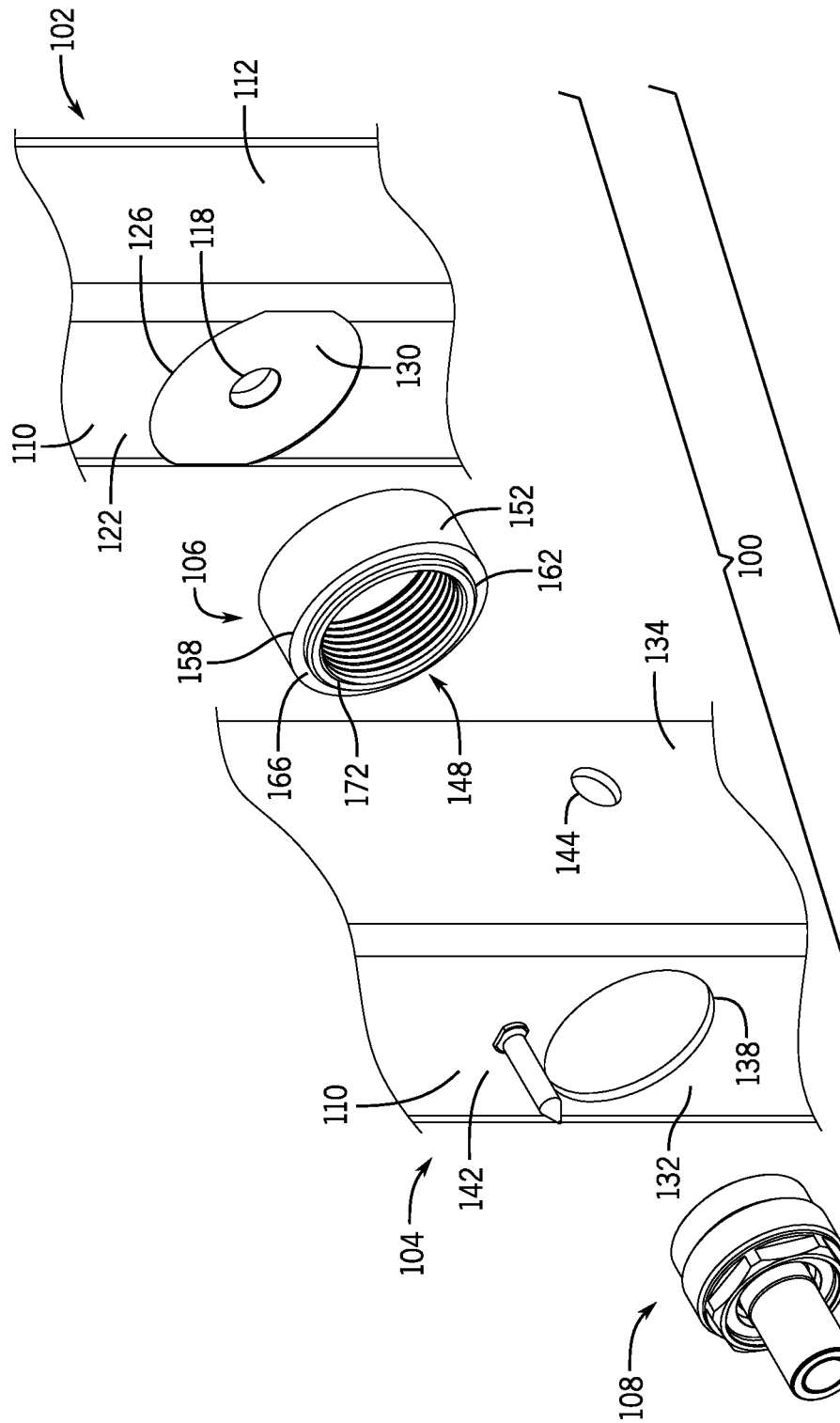
FIG. 3 is a top front right exploded isometric view of the section of the manifold assembly of FIG. 2.
Figure 4:
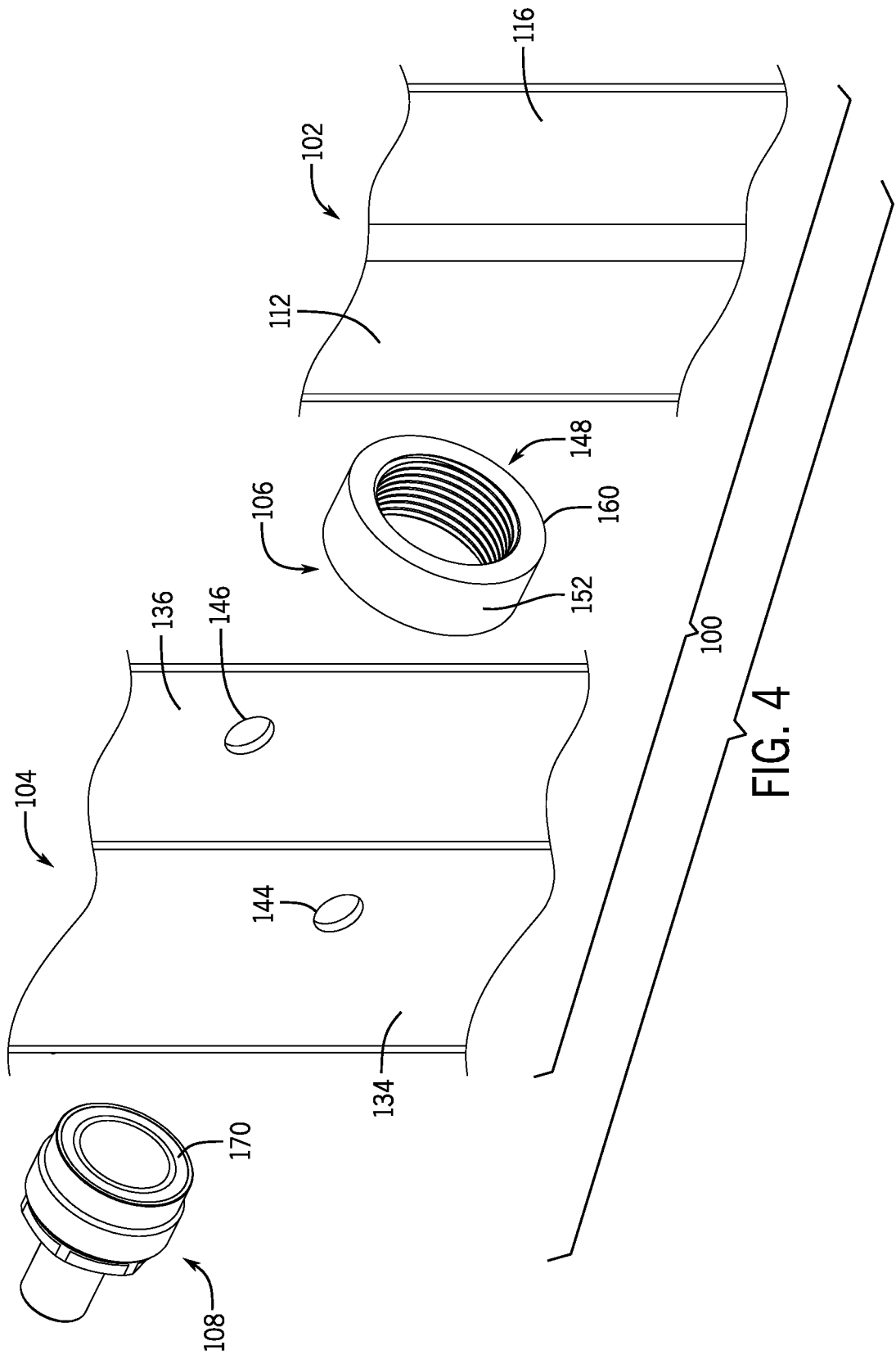
FIG. 4 is a top rear right exploded isometric view of the section of the manifold assembly of FIG. 2.

In the context of a server rack (not shown), FIG. 1 illustrates an example manifold assembly 100 for delivery of cooling flow to electronics (not shown) supported within the server rack. In the illustrated example, the manifold assembly 100 has a manifold tube 102 (hidden, shown in FIG. 3), a channel 104, and a plurality of bushings 106 each configured to receive a quick-connect coupling 108. The manifold assembly 100 can be coupled to a server rack to provide a path for coolant to flow through and transfer heat away from electronics stored therein.

FIGS. 2 through 6 provide close-up, exploded, and cross-sectional views of one of the plurality of bushings 106 as it is positioned within the manifold assembly 100 along with one of the quick-connect couplings 108. For ease of description, discussion will be focused around the particular elements shown in FIGS. 2 through 6, but it should be noted that the same discussion applies to similar elements and relationships within the manifold assembly 100. The manifold tube 102 can be formed from square tubing as shown here with a first manifold wall 110, a second manifold wall 112, a third manifold wall 114, and a fourth manifold wall 116 (all shown in FIG. 5). The manifold tube 102 also has a set of port holes spaced along the first wall 110, including a port hole 118 (shown in FIG. 3) extending from an internal surface 120 to an external surface 122 of the first manifold wall 110. The port hole 118 has a port hole diameter 124 (shown in FIG. 5). Further, a locating feature, here shown as a spotface 126 in FIG. 3, extends inward from the external surface 122 of the first manifold wall 110 toward the internal surface 120 and has a spotface diameter 128 (shown in FIG. 6) and a spotface surface 130 (shown in FIG. 3). In some embodiments, the spotface 126 is concentrically aligned with the port hole 118. In some embodiments, the spotface surfaces 130 along the first manifold wall 110 are co-planar. The port hole 118 and the spotface 126 can be formed through a machining process such as, for example, laser-cutting with a Computerized Numerical Control (CNC) machine. The laser-cutting does not deform the metal comprising the manifold tube 102 and allows for tighter tolerances to be maintained within the manifold assembly 100. For example, the spotface surfaces 130 can be provided within the same plane because there is little to no distortion along the length of the manifold tube 102.

Continuing, the channel 104 can be formed as a C-channel as shown in FIGS. 2-6. The channel 104 includes a first channel wall 132, a second channel wall 134, and a third channel wall 136 (all shown in FIG. 5). The channel 104 also includes a plurality of channel apertures spaced along the first channel wall 132, including a channel aperture 138 extending from an internal surface 140 to an external surface 142 of the first channel wall 132. The channel apertures 138 are spaced similarly to the port holes 118 in the manifold tube 102 and are configured to be alignable with the port holes 118. The channel apertures 138 can be formed through a laser-cutting process with a CNC machine, as discussed above with respect to the port holes 118, to reduce or eliminate distortion through thermal influence and to maintain tight tolerances within the manifold assembly.

Figure 2:
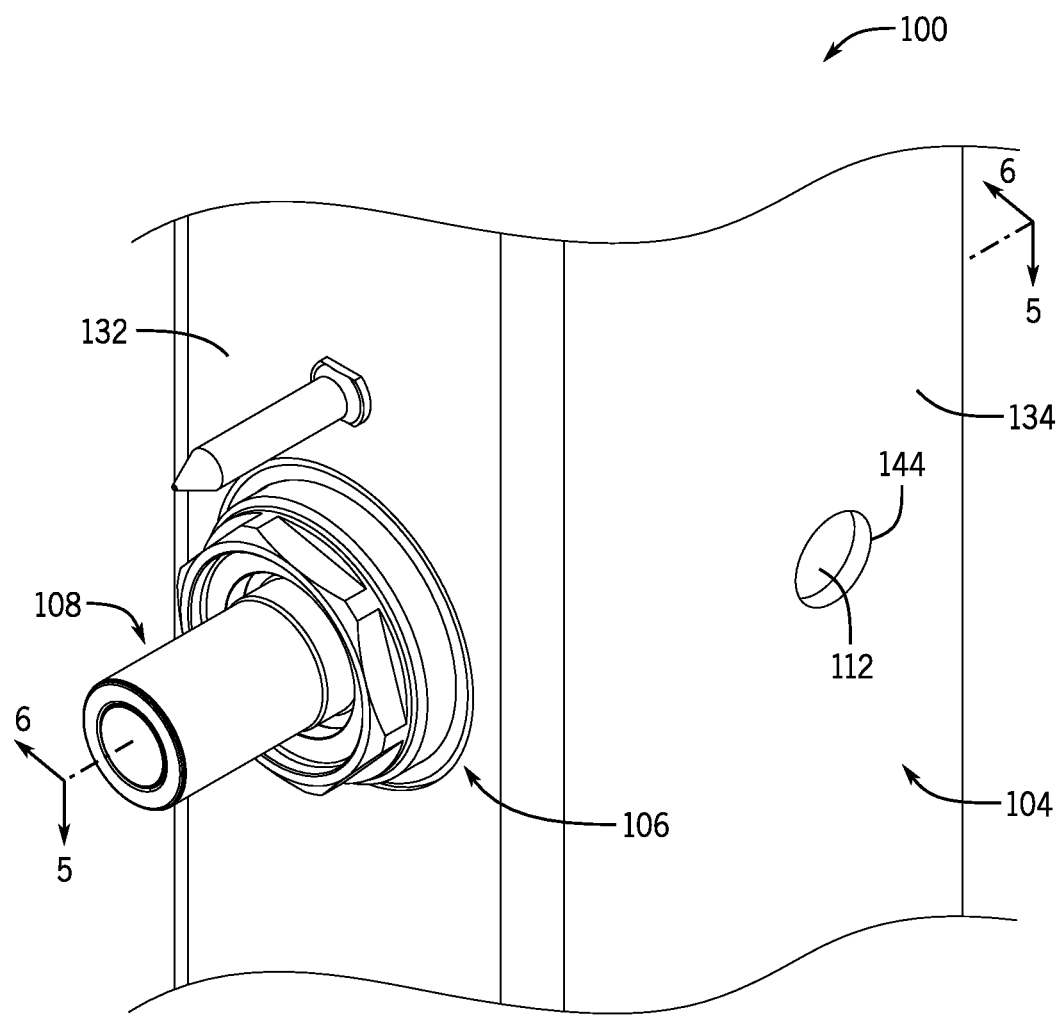
FIG. 2 is a top front right enlarged detail isometric view of the manifold assembly within circle 2 of FIG. 1.
Figure 5:
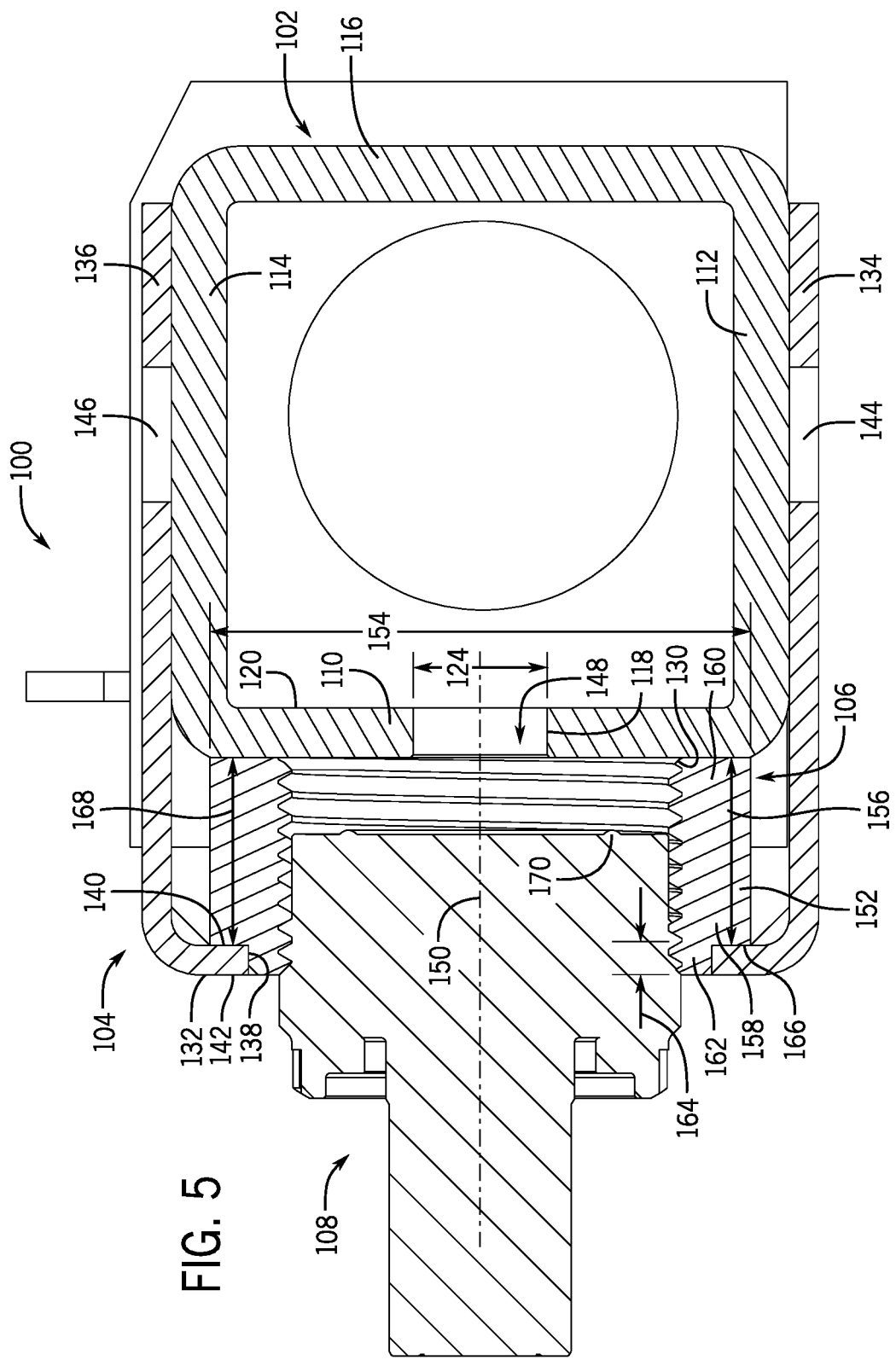
FIG. 5 is a cross-sectional view of the section of the manifold assembly of FIG. 2 along line 5-5.

Additionally, as shown in FIG. 5, the channel 104 is configured to receive the manifold tube 102 at least partially therein and there along. The second channel wall 134 is positioned adjacent and along the second manifold wall 112 and the third channel wall 136 is positioned adjacent and along the third manifold wall 114. The manifold tube 102 and the channel 104 can be secured together by, for example, plug welding and/or mechanical fastening. As shown in FIGS. 2 and 5, for example, plug holes 144, 146 in the second and third channel walls 134, 136, respectively, are provided to plug weld the channel 104 to the manifold tube 102 at locations located directly across from each other, on either side of the channel aperture 138 and the port hole 118. The plug holes 144, 146 can be formed through laser-cutting with a CNC machine. In some embodiments, plug holes 144, 146 can be provided along the channel 104 at locations adjacent more than one or all of the channel apertures 138. In some embodiments, the manifold tube 102 and the channel 104 can also be similarly welded and/or mechanically fastened together at the distal ends of the manifold tube 102 and the channel 104. This can reduce the amount of stress concentrated at the most distally located port hole locations. In the case of welding, the symmetrical locations of the welds reduces the likelihood of deformation of the manifold assembly 100 because any shrinkage experienced from the weld between the second manifold wall 112 and the second channel wall 134 will be countered by shrinkage experienced from the weld between the third manifold wall 114 and the third channel wall 136. Thus, providing a symmetrical welding pattern maintains the tight tolerances needed to effectively connect and ensure predictable first-axis alignment between the coolant connector of a rack support (not shown) and the quick-connect couplings 108 of the manifold assembly.

Figure 6:
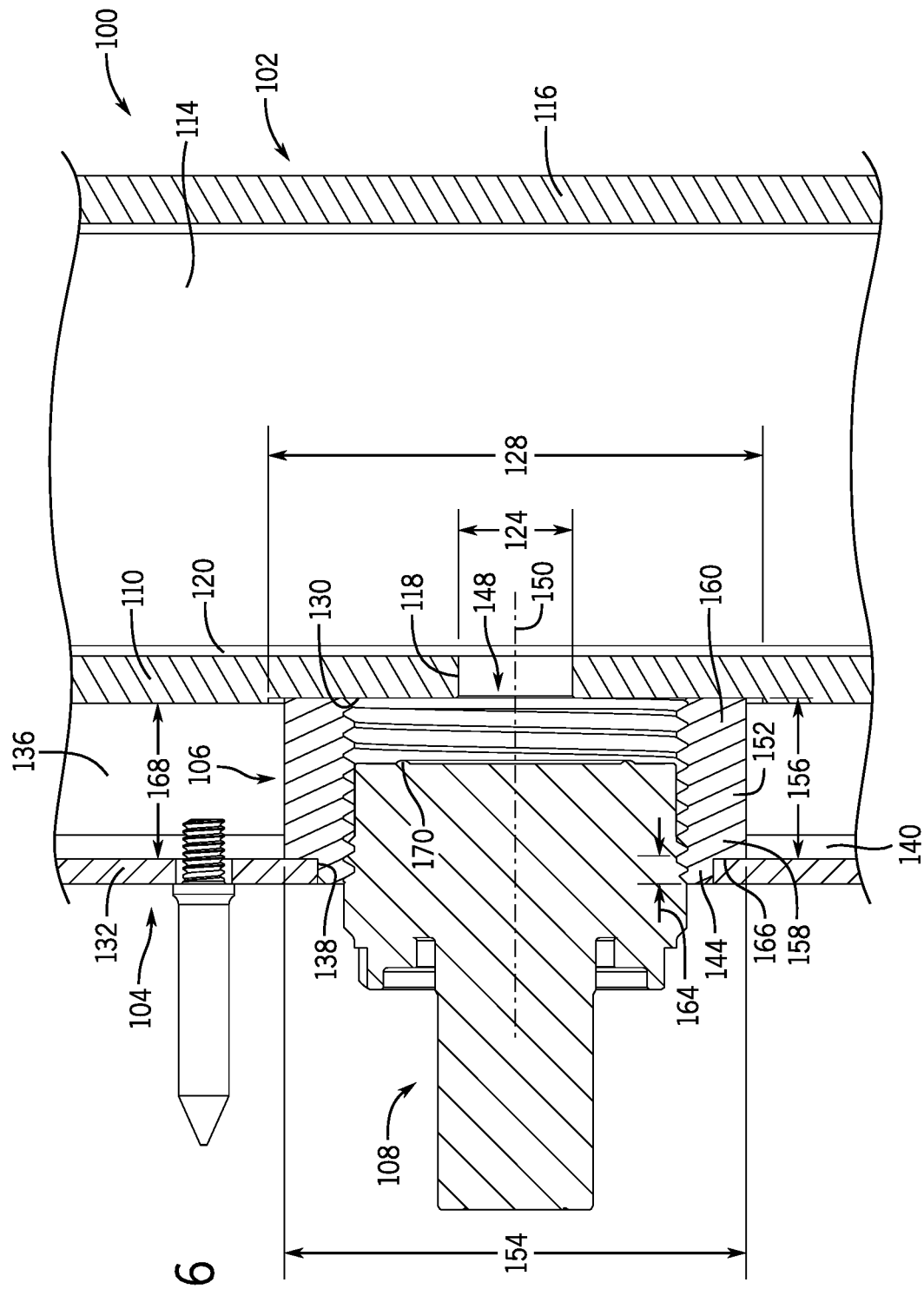
FIG. 6 is a cross-sectional view of the section of the manifold assembly of FIG. 2 along line 6-6.
Figure 7:
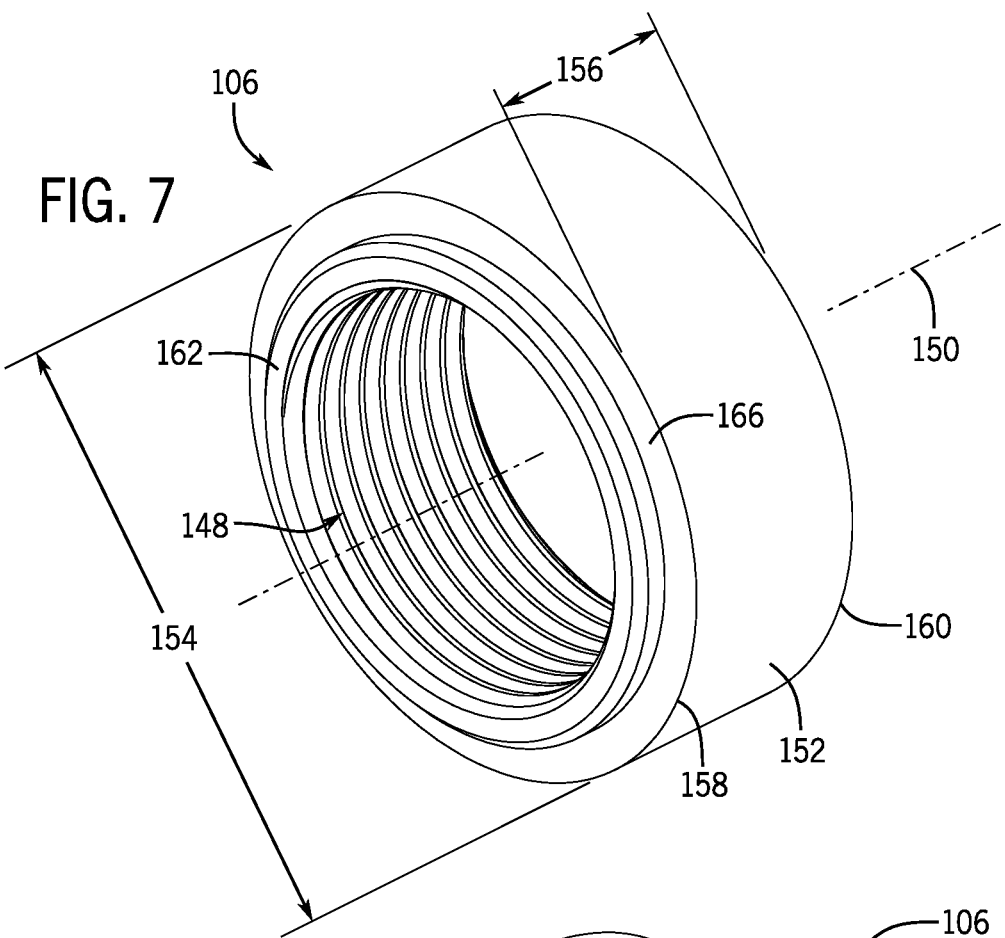
FIG. 7 is a top front right isometric view of a bushing of the manifold assembly of FIG. 1 according to an embodiment of the invention.
Figure 8:
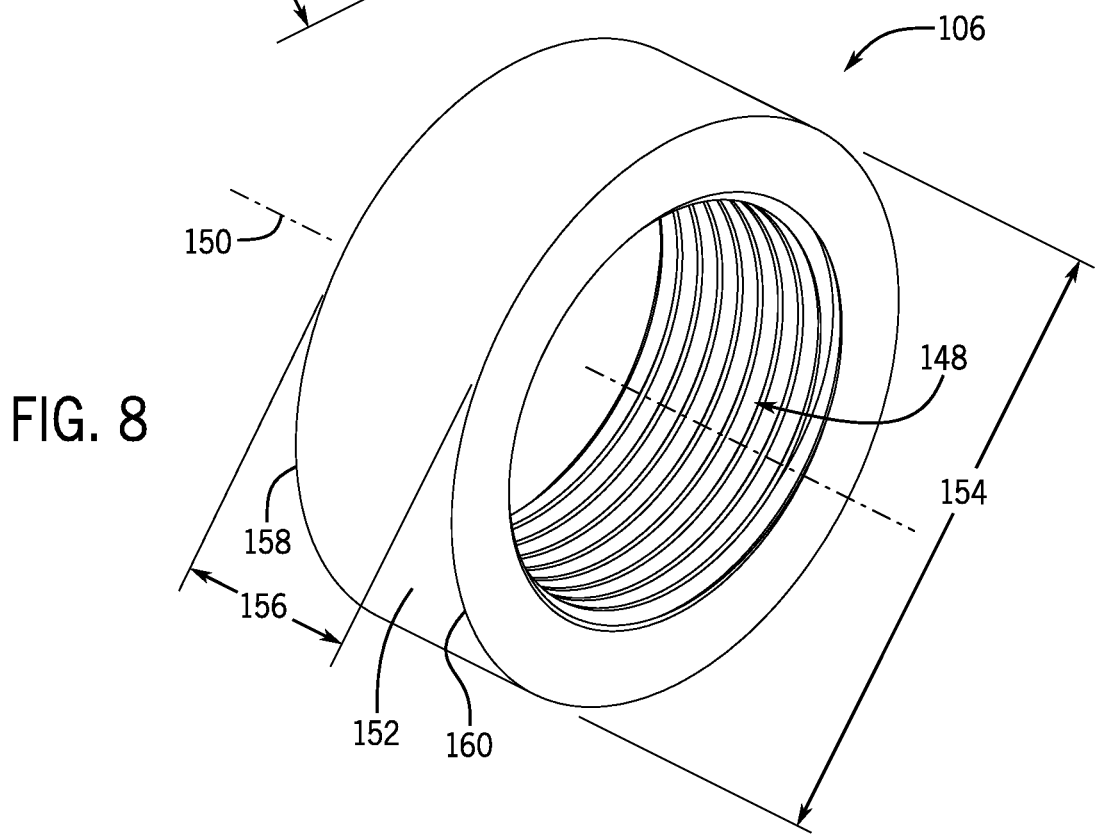
FIG. 8 is a top rear right isometric view of the bushing of FIG. 7.

Continuing to look at FIGS. 2 through 6, with further reference to FIGS. 7 and 8, the bushing 106 is shown within the manifold assembly 100 and in isolation. The bushing 106 has a throughbore 148 extending along a bushing axis 150. In some embodiments, the throughbore 148 is threaded and is configured to be threadably engageable with a quick-connect coupling such as, for example, the quick-connect coupling 108 (shown in FIG. 2). The bushing 106 also has a bushing body 152 with a body diameter 154 and a body length 156 extending from a first end 158 to a second end 160. Further, a pilot ridge 162 extends from the first end 158 and around the throughbore 148. The pilot ridge 162 has a ridge depth 164 (shown in FIG. 5) extending between a front face 172 of the pilot ridge 162 and the first end 158 of the bushing body 152, defining a shoulder 166 on the bushing body 152.

The position of the bushing 106 between the manifold tube 102 and the channel 104 is shown in FIGS. 5 and 6. The pilot ridge 162 of the bushing 106 is sized and configured to be received within the channel aperture 138 in the first channel wall 132 of the channel 104, with the shoulder 166 abutting the internal surface 140. In some embodiments, the bushing 106 can be tack-welded to the channel 104 at locations around the first end 158 of the bushing body 152 and the internal surface 140 to secure the coupling thereof. In some embodiments, the bushing 106 can be pressed, or otherwise affixed, (e.g., press-fit, clearance/free-fit, or thermal/shrink-fit) to the channel 104. In some embodiments, when the bushing 106 is coupled to the channel 104, the bushing axis 150 will be in alignment with the center of the channel aperture 138. Further, the ridge depth 164 can have a dimension about equal to the thickness of the first channel wall 132. In this configuration, the front face 172 of the pilot ridge 162 will be about flush with the external surface 142 of the first channel wall 132 and can act as a depth guide to provide a visual or tactile confirmation that the pilot ridge 162 has been fully received within the channel aperture 138.

Continuing, the second end 160 of the bushing body 152 is configured to be received within the spotface 126 in the first manifold wall 110 of the manifold tube 102. The body diameter 154 can be configured to be about the same size as the spotface diameter 128, if not slightly smaller. The spotface 126 is configured to locate the bushing body 152 in a predetermined location along the manifold tube 102. In some embodiments, when the bushing body 152 is received within the spotface 126, the bushing axis 150 will be aligned with the center of the port hole 118.

As shown in FIGS. 5 and 6, the bushing 106 is captivated between the channel 104 and the manifold tube 102, with the bushing axis 150 aligned with a center of the channel aperture 138, spacing the first channel wall 132 from the first manifold wall 110 a distance 168. The combination of the channel 104 and the manifold tube 102 increases the strength of the manifold assembly 100 by increasing the moment arm thereof. In some embodiments, the strength of the manifold assembly 100 can be increased by increasing the distance 168 through increasing the body length 156 of the bushing 106. The increased assembly strength, along with the bushing 106 being an independent element, permits using thin-wall tubing for the manifold tube 102 because thick-wall tubing is not required to form threads therein to receive a quick-connect coupling, for example. However, larger gauge tubing for the manifold tube 102 can be used to accommodate higher pressure applications. Further, the bushing eliminates the need to form a threaded port through other methods such as, for example, flow drilling, which forms threaded ports that extend into the manifold.

An example quick-connect coupling 108 is shown partially installed within the bushing 106 in FIGS. 5 and 6. The quick-connect coupling 108 has an O-ring 170 and is configured to be threadably received within the throughbore 148 of the bushing 106 and urged against the spotface 126 in the first manifold wall 110, whereby the O-ring 170 provides a liquid-tight seal. The welding and/or mechanical fastening of the second and third channel walls 134, 136 to the second and third manifold walls 112, 114 adjacent the location at which the bushing 106 is captivated, reduces any potential for movement of the channel 104 relative to the manifold tube 104 due to overtightening of the bushing 106 and further ensures a liquid-tight seal.

It should be noted that the channel 104 and the bushing 106 will be isolated from any coolant flowing through the manifold assembly 100 and the rest of the cooling system. Therefore, it is contemplated that the material used for the channel 104 and/or the bushing 106 can be different than the material used for the manifold tube 102. For example, a material for the channel 104 and/or the bushing 106 can be formed from a material that is lighter, more thermally conductive, less expensive, higher strength, etc. if desired.

The manifold assembly 100 also allows for greater flexibility as it relates to the characteristics of any particular cooling system. For example, a manifold tube (e.g., the manifold tube 102) can be provided with standardized port hole sizes and locations and a channel (e.g., the channel 104) can also be provided with standardized channel aperture sizes and locations configured to align with the port holes of the manifold tube 102. Modifications to the characteristics of the system can be achieved by coupling bushings (e.g., the bushings 106) of different sizes to the channel 104 to receive quick-connect couplings of different flowrates depending on the application and/or to increase the strength of the manifold assembly 100 by increasing the length of the bushings 106.

Figure 9:
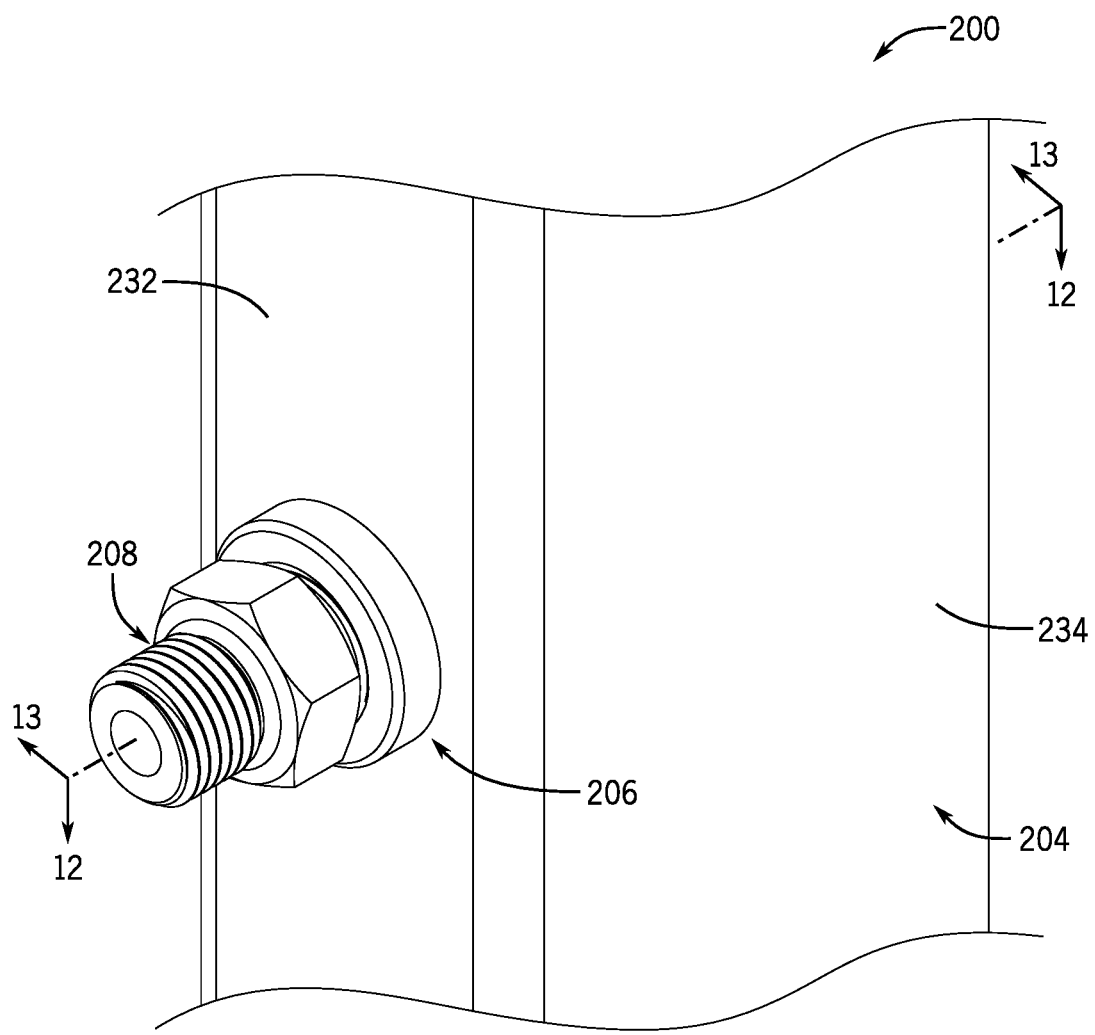
FIG. 9 is a top front right enlarged detail view of the manifold assembly according to another embodiment of the invention.
Figure 10:
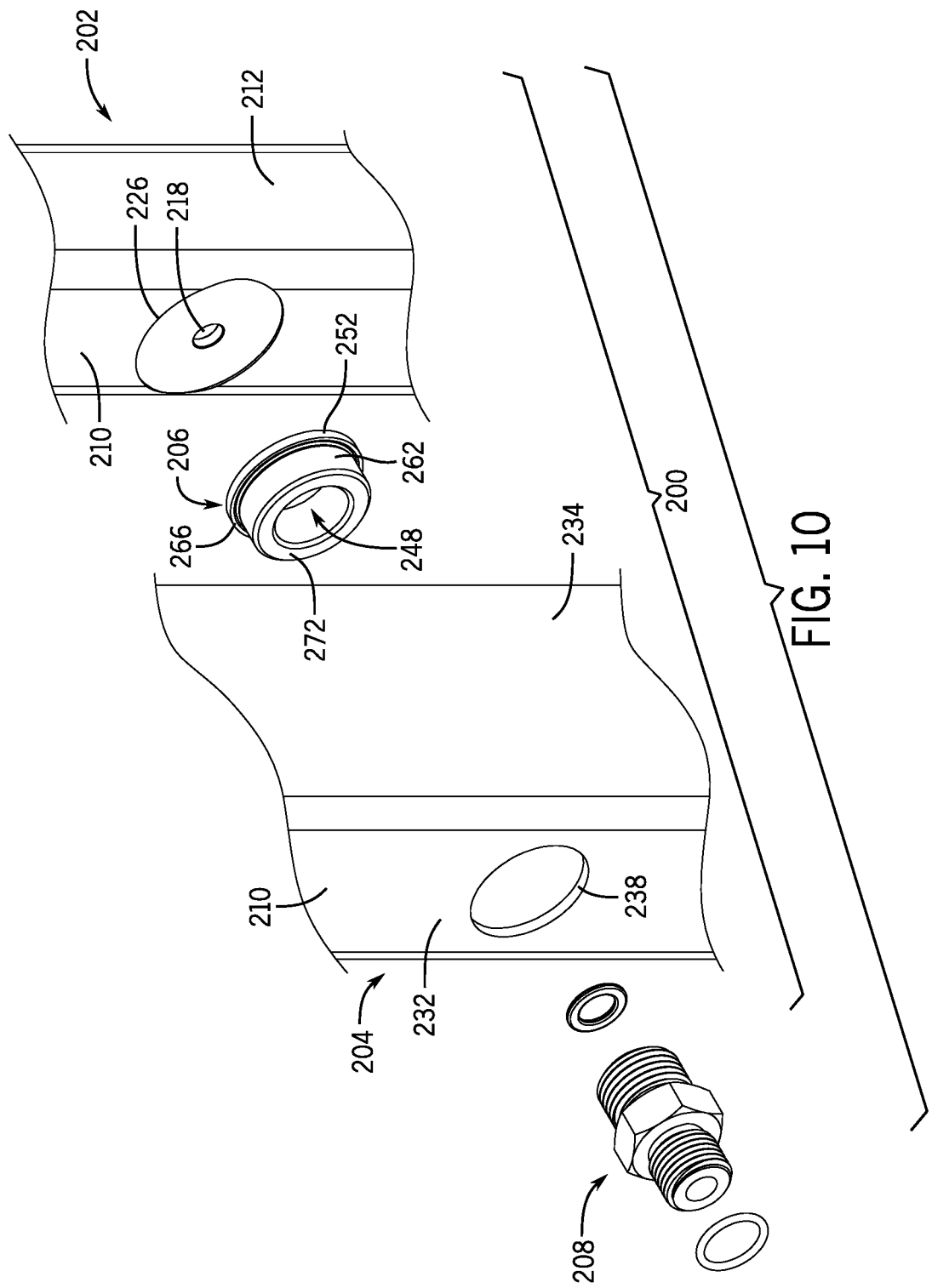
FIG. 10 is a top front right exploded isometric view of the section of the manifold assembly of FIG. 9.
Figure 11:
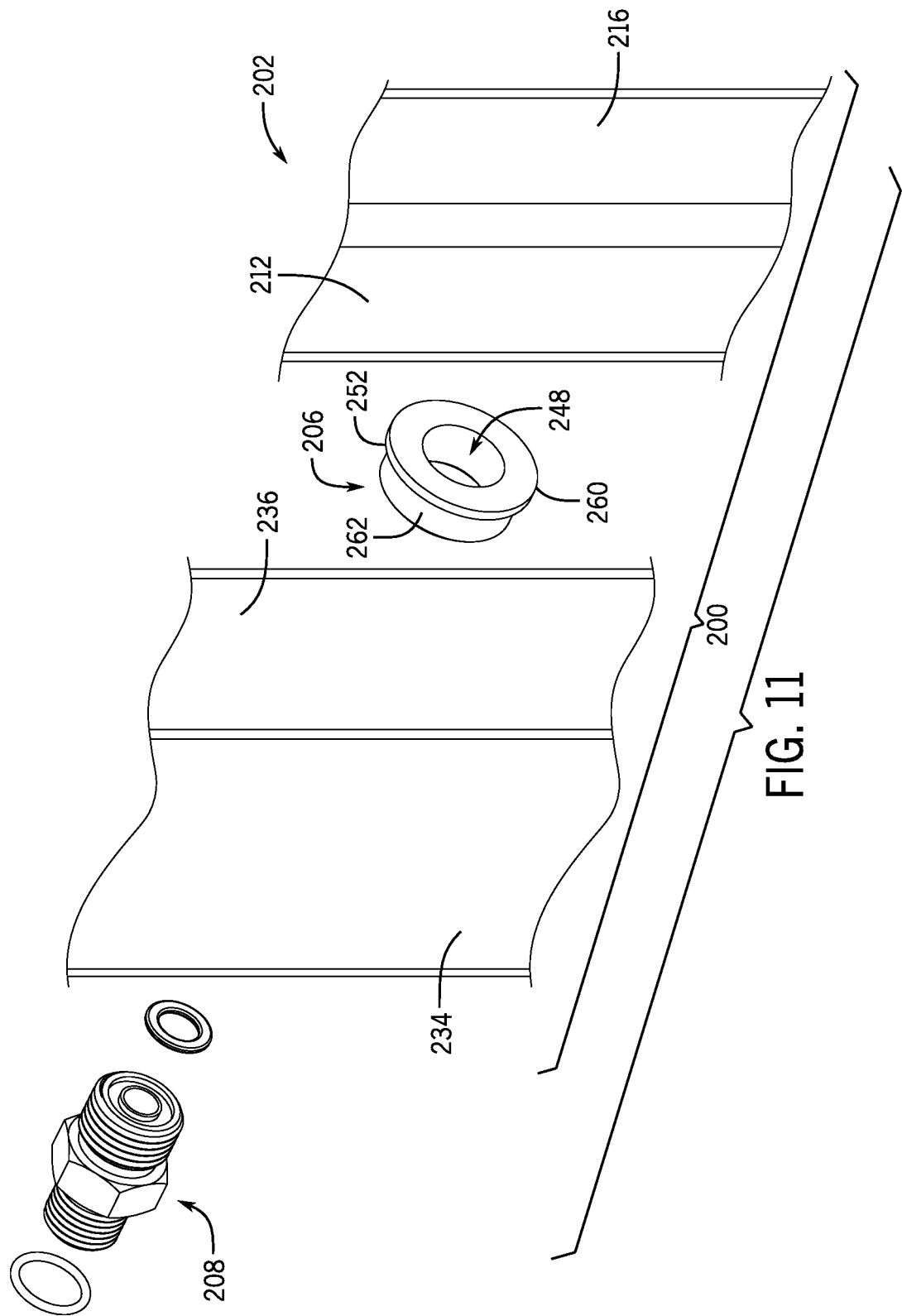
FIG. 11 is a top rear right exploded isometric view of the section of the manifold assembly of FIG. 9.

FIGS. 9-1 illustrate another embodiment of a manifold assembly 200 according to the invention, as also can be used in a liquid cooling system for cooling electrical equipment in a server rack, for example. In many aspects, the manifold assembly 200 is similar to the manifold assembly 100 described above and similar numbering in the 200 series is used for the manifold assembly 200. For example, the manifold assembly 200 has a manifold tube 202, a channel 204, and a bushing 206. Additionally, the bushing 206 has a front face 272 and a throughbore 248 extending along a bushing axis 250. The throughbore 248 can be threaded and can be configured to be threadably engageable with a quick-connect coupling such as, for example, the quick-connect coupling 208 (shown in FIG. 9). The bushing 206 also has a bushing body 252 with a body diameter 254 and a body length 256 extending from a first end 258 to a second end 260. Further, a pilot ridge 262, with a ridge depth 264, extends from the first end 258 and around the throughbore 248.

Further, the manifold tube 202 has a first manifold wall 210, with at least one port hole 218 and at least one spotface 226, a second manifold wall 212, a third manifold wall 214, and a fourth manifold wall 216; the channel 204 has a first channel wall 232, with at least one channel aperture 238, a second channel wall 234, and a third channel wall 236; and the bushing 206 is captivated between the channel 204 and the manifold tube 202, with the bushing axis 250 aligned with a center of the channel aperture 238, spacing the first channel wall 232 from the first manifold wall 210 a distance 268. Additionally, the manifold tube 202 and the channel 204 can be secured together by securing the second and third channel walls 234, 236, to the second and third manifold walls 212, 214, respectively, at locations located directly across from each other, on either side of the channel aperture 238 and the port hole 218.

Figure 12:
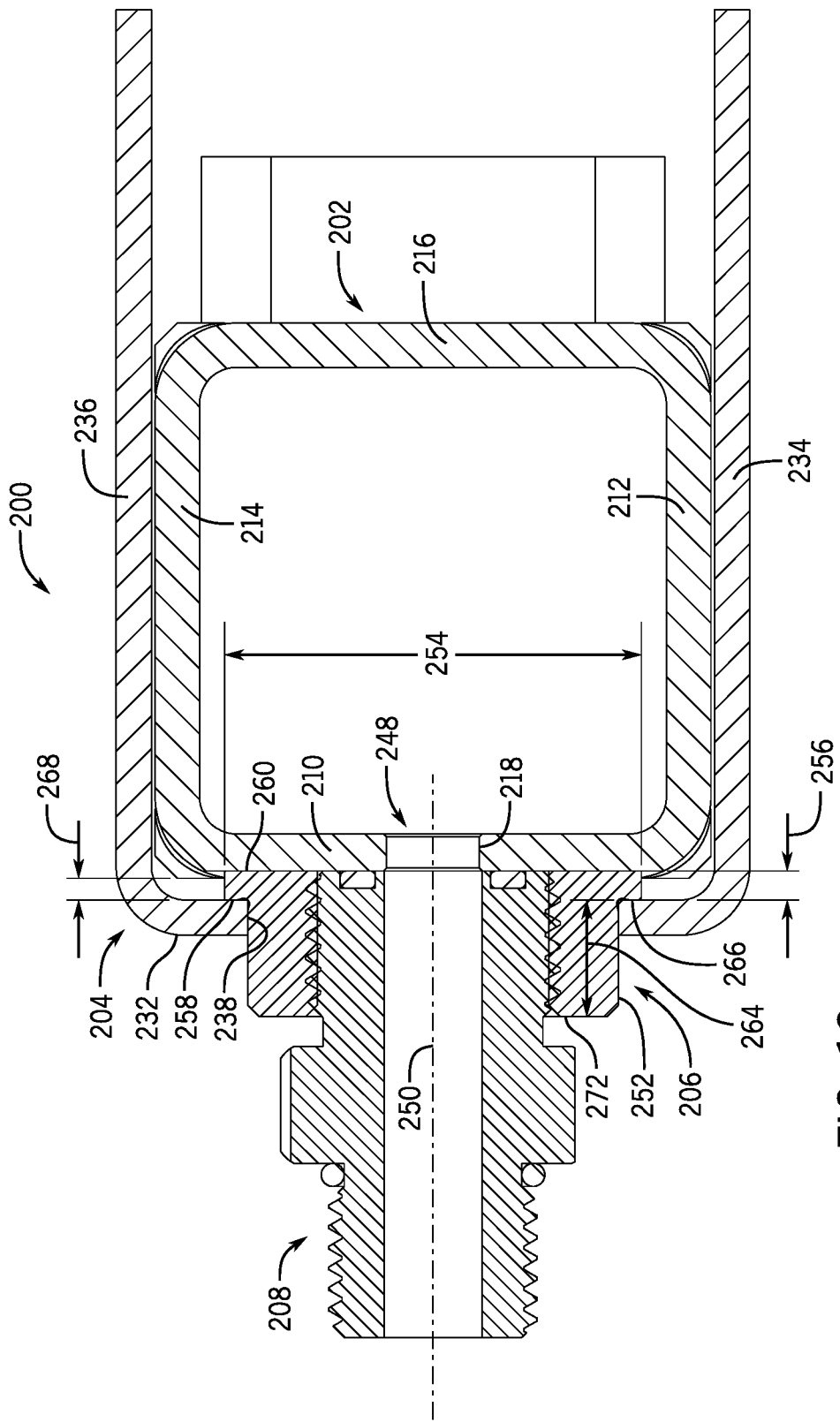
FIG. 12 is a cross-sectional view of the section of the manifold assembly of FIG. 9 along line 12-12.
Figure 13:
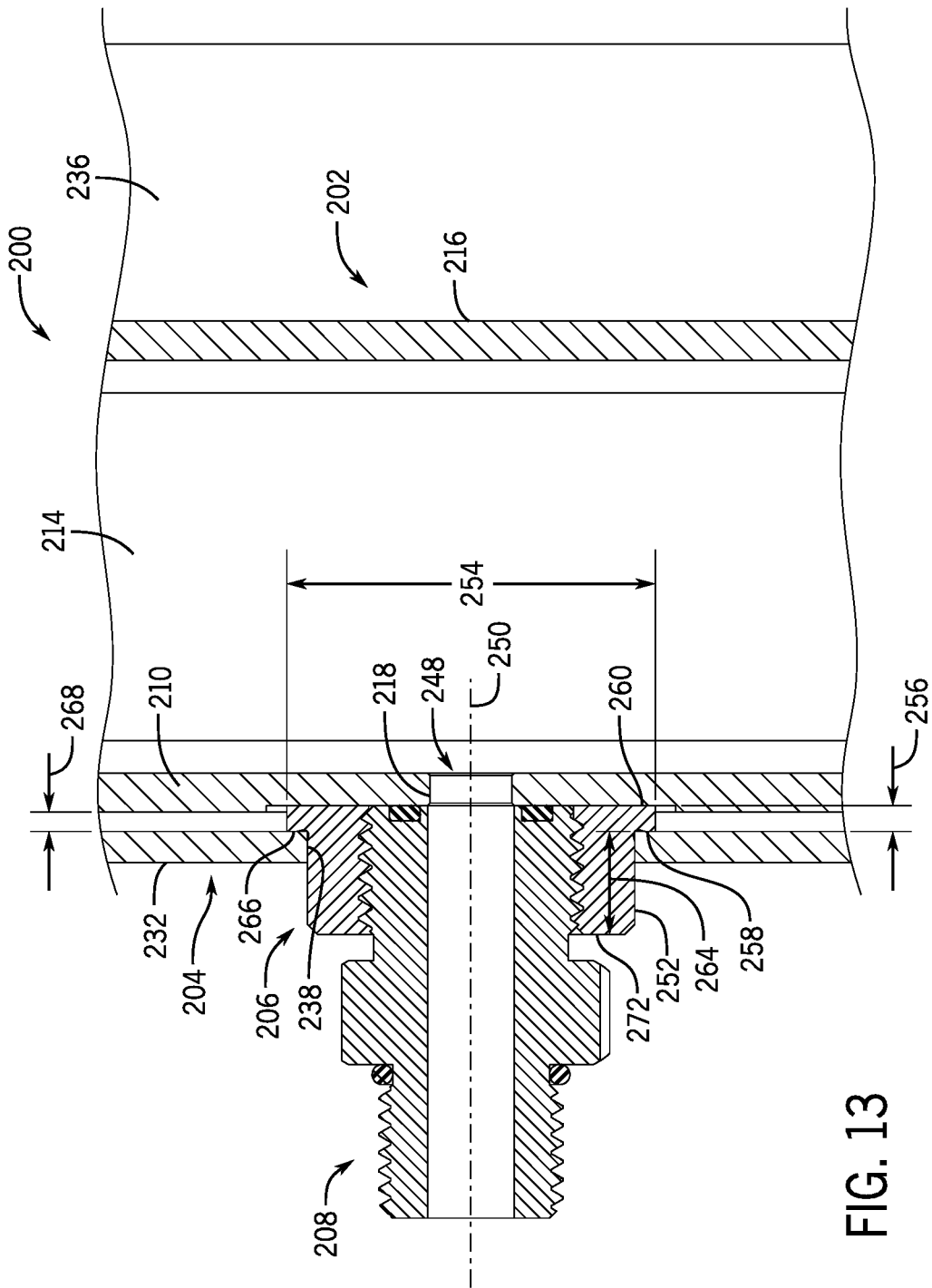
FIG. 13 is a cross-sectional view of the section of the manifold assembly of FIG. 9 along line 13-13.
Figure 16:
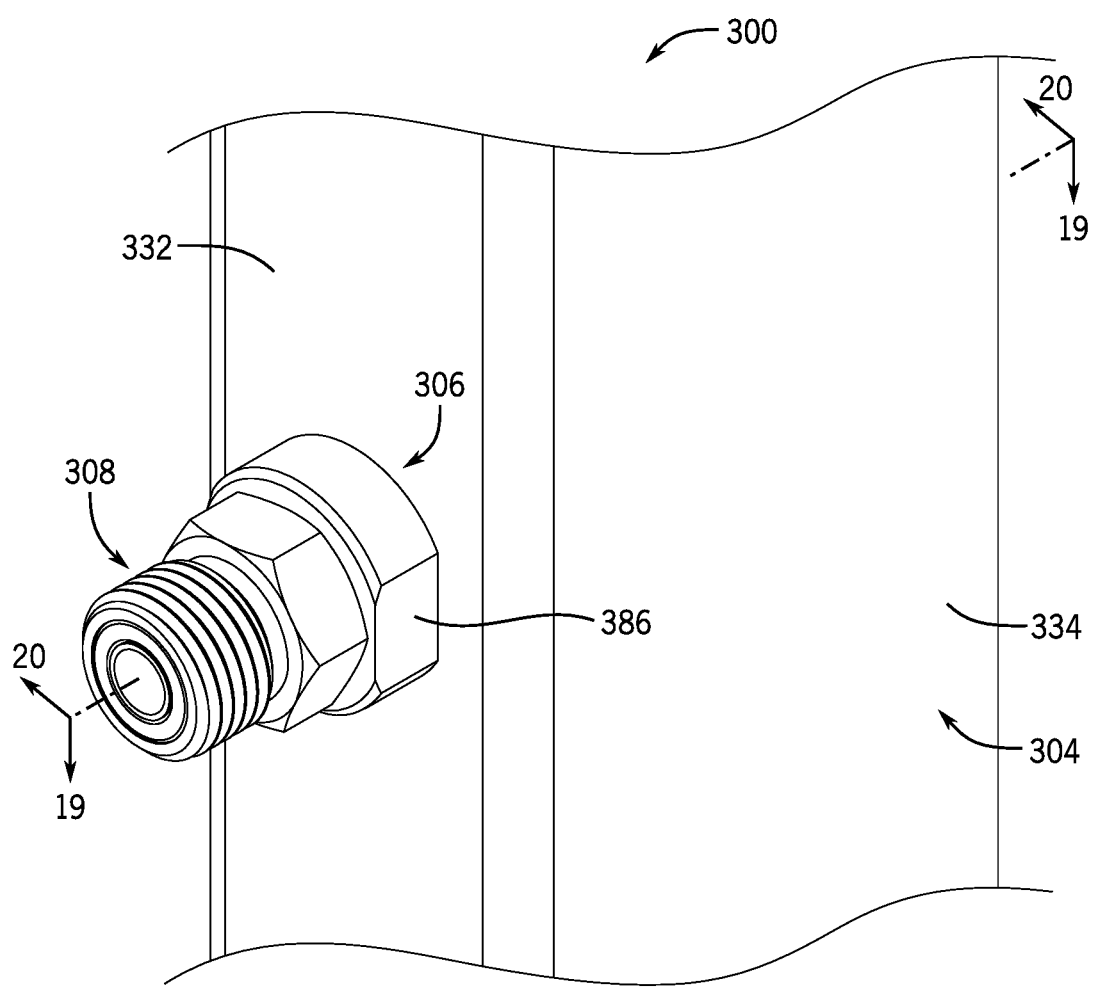
FIG. 16 is a top front right enlarged detail isometric view of a manifold assembly according to another embodiment of the invention.

In some aspects, however, the manifold assemblies 100, 200 differ from each other. For example, the bushing 206 has is formed with different dimensions than the bushing 106. The ridge depth 264 (shown in FIG. 12) of the bushing 206 defines a shoulder 266 on the first end 258 of the bushing body 252, similar to the bushing 106. However, where the body length 156 is greater than the ridge depth 164 in the bushing 106, the body length 256 is less than the ridge depth 264 in the bushing 206. Further, the pilot ridge 262 extends through a channel aperture 238 on the first channel wall 232 of the channel 204.

FIGS. 16-22 illustrate another embodiment of a manifold assembly 300 according to the invention, as also can used in a liquid cooling system for cooling electrical equipment in a server rack, for example. In many aspects, the manifold assembly 300 is similar to the manifold assembly 200 described above and similar numbering in the 300 series is used for the manifold assembly 300. For example, the manifold assembly 300 has a manifold tube 302, a channel 304, and a bushing 306. Additionally, the bushing 306 has a front face 372 and a throughbore 348 extending along a bushing axis 350. The throughbore 348 can be threaded and can be configured to be threadably engageable with a quick-connect coupling such as, for example, the quick-connect coupling 308 (shown in FIG. 16). The bushing 306 also has a bushing body 352 with a body diameter 354 and a body length 356 extending from a first end 358 to a second end 360. Further, a pilot ridge 362, with a ridge depth 364, extends from the first end 358, around the throughbore 348, and defines a shoulder 366. Also, the body length 356 can be less than the ridge depth 364.

Further, the manifold tube 302 has a first manifold wall 310, with at least one port hole 318 and at least one spotface 326, a second manifold wall 312, a third manifold wall 314, and a fourth manifold wall 316; the channel 304 has a first channel wall 332, with at least one channel aperture 338, a second channel wall 334, and a third channel wall 336; and the bushing 306 is captivated between the channel 304 and the manifold tube 302, with a bushing axis 350 aligned with a center of the channel aperture 338, spacing the first channel wall 332 from the first manifold wall 310 a distance 368. Additionally, the manifold tube 302 and the channel 304 can be secured together by securing the second and third channel walls 334, 336, to the second and third manifold walls 312, 314, respectively, at locations located directly across from each other, on either side of the channel aperture 338 and the port hole 318.

In some aspects, however, the manifold assemblies 200, 300 differ from each other. For example, the bushing 306 has is formed with different features than the bushing 206. The bushing 306 is formed to provide a liquid-tight face seal with the manifold tube 302 and the quick-connect coupling 308. For example, the bushing 306 has a rear surface 374 on the second end 360, opposite the shoulder 366, that is configured to make superficial contact with the spotface 326 within the manifold tube 302 (shown in FIGS. 19, 20, and 22). A rear surface groove 376 is provided within the rear surface 374 in which a first O-ring 378 can be placed. With the bushing 306 captured between the channel 304 and the manifold tube 302, the O-ring 378 provides a liquid-tight face seal between the bushing 306 and the manifold tube 302. Additionally, the bushing 306 has a chamfer 380 in the throughbore 348 adjacent the front face 372 (shown in FIGS. 19 through 21) The chamber 380 is sized and configured to receive a second O-ring 382 therein. The second O-ring 382 provides a liquid-tight seal between the bushing 306 and the quick-connect coupling 308.

Figure 17:
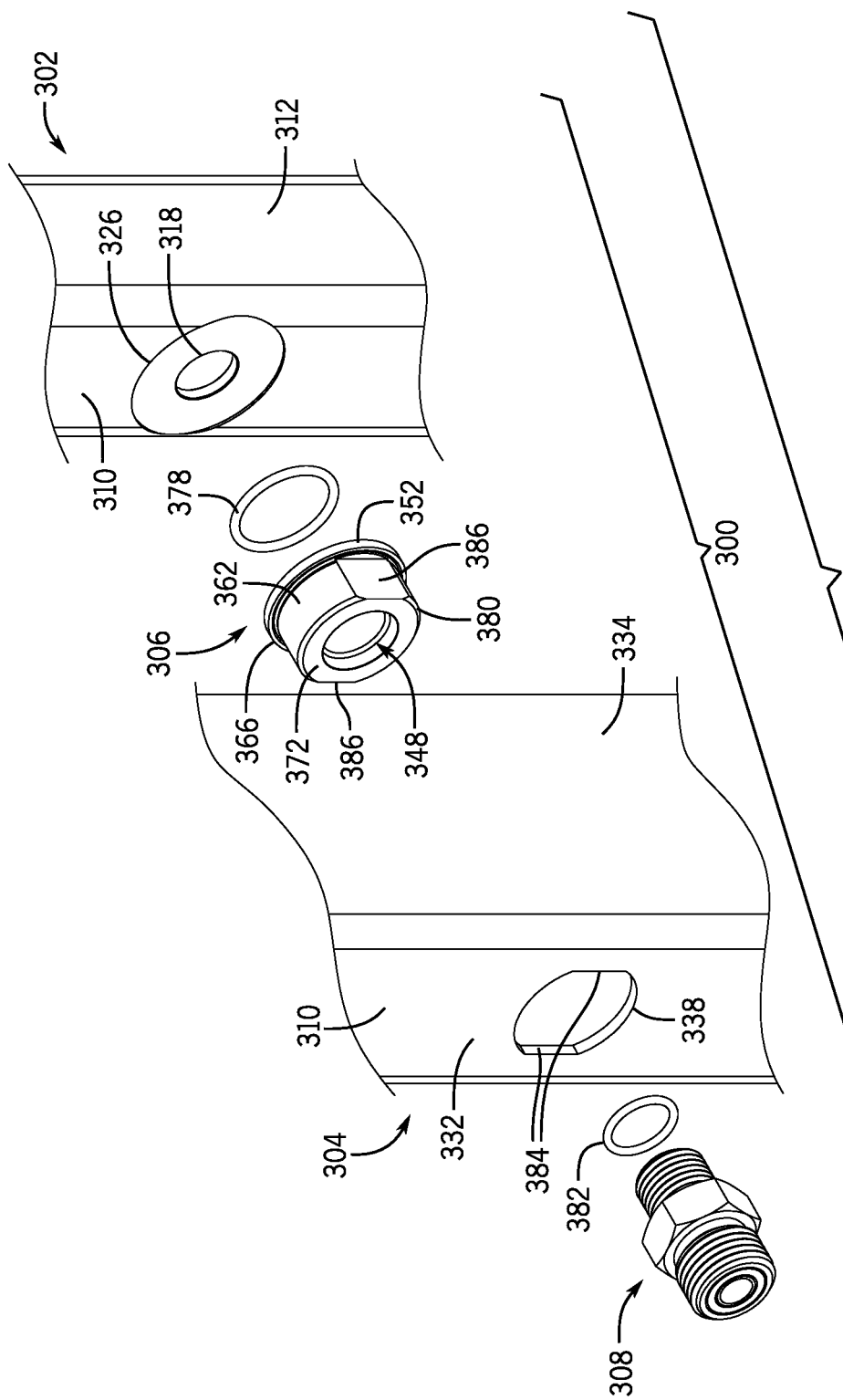
FIG. 17 is a top front right exploded isometric view of the section of the manifold assembly of FIG. 16.
Figure 18:
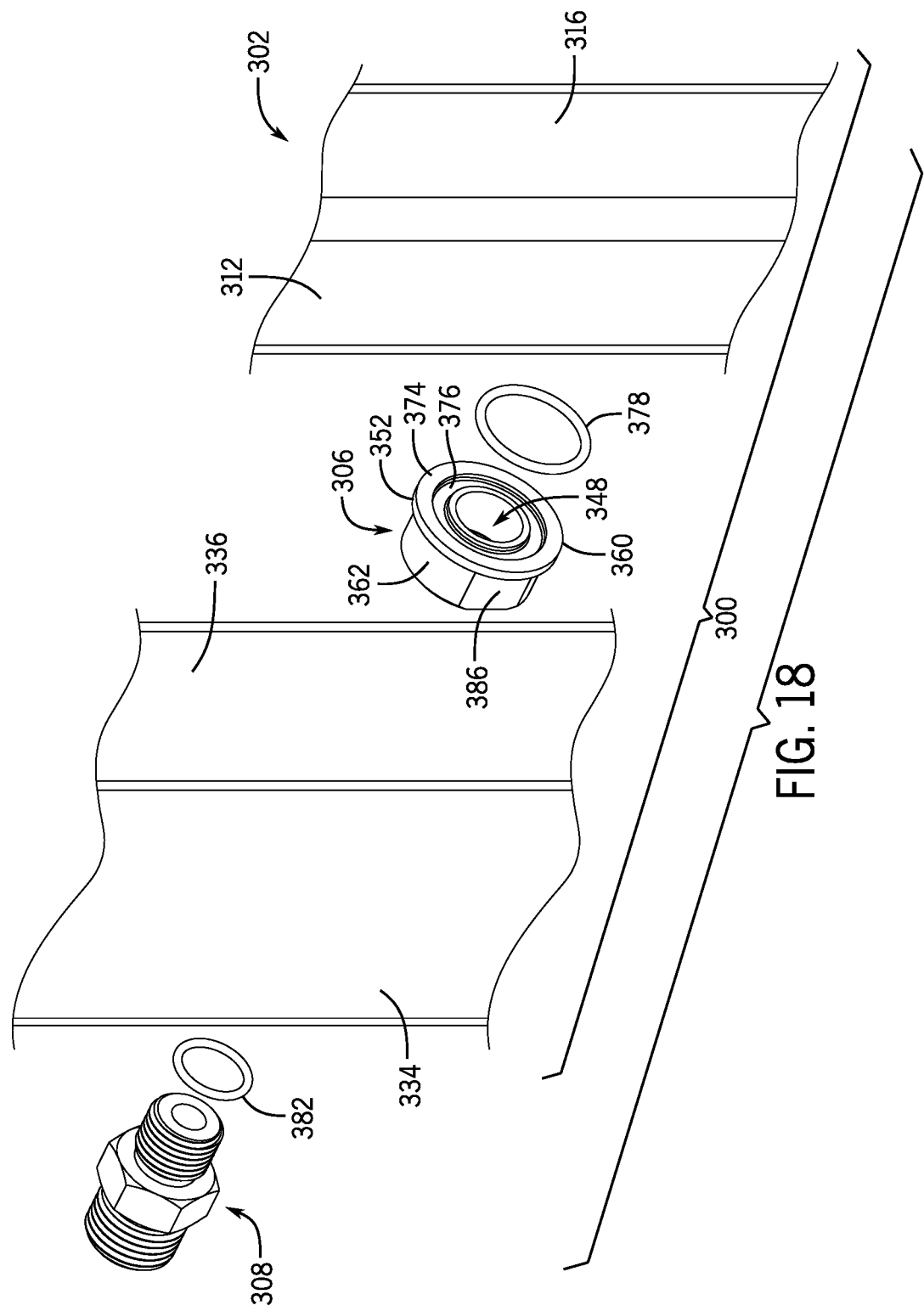
FIG. 18 is a top rear right exploded isometric view of the section of the manifold assembly of FIG. 16.
Figure 19:
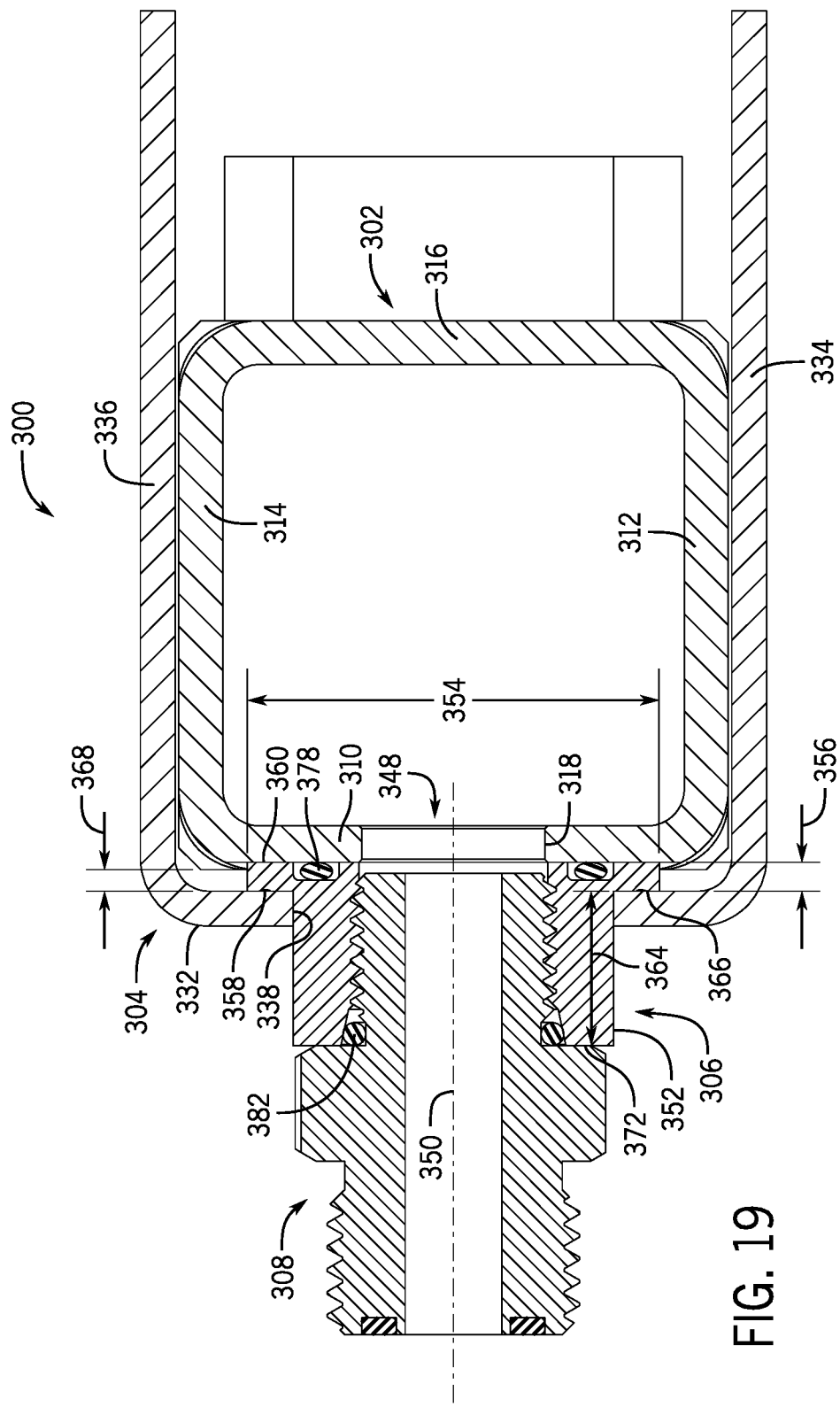
FIG. 19 is a cross-sectional view of the section of the manifold assembly of FIG. 16 along line 19-19.
Figure 20:
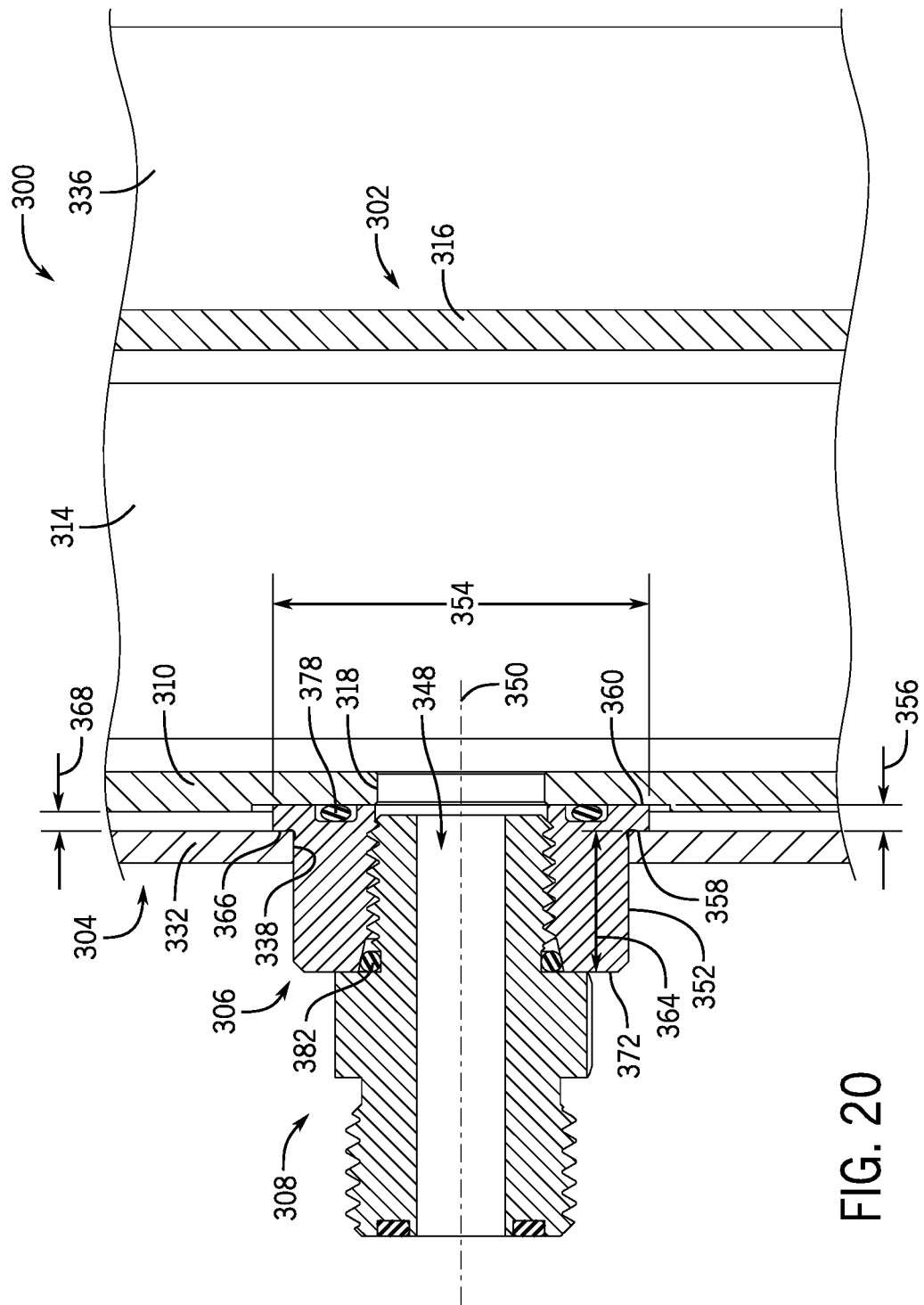
FIG. 20 is a cross-sectional view of the section of the manifold assembly of FIG. 16 along line 20-20.

Additionally, the channel aperture 338 and the pilot ridge 362 are similarly shaped to provide an indexed fit therebetween. For example, as shown in FIG. 17, both the channel aperture 338 and the pilot ridge 362 have a mostly arcuate profile with a set of two oppositely situated flat areas 384, 386 (i.e., a "double-D" or "DD" profile), respectively. Indexing the fit between the channel aperture 338 and the pilot ridge 362 can aid in resisting rotation potentially induced when threading a quick-connect fitting 308 into the bushing 306. Indexing can also eliminate the need for welding or otherwise rigidly securing the bushing 306 to the channel 304 (e.g., through welding). The indexed profile of the pilot ridge 362 can also be arranged to allow a wrench (not shown) to engage therewith to aid in countering the torque induced during the installation of the quick-connect fitting 308. Other indexing profiles are contemplated. For example, four flat areas of equal length and equally spaced can be provided (e.g., a "DDDD" profile).

In some implementations, devices or systems disclosed herein can be utilized or installed using methods embodying aspects of the invention. Correspondingly, description herein of particular features or capabilities of a device or system is generally intended to inherently include disclosure of a method of using such features for intended purposes and of implementing such capabilities. Similarly, express discussion of any method of using a particular device or system, unless otherwise indicated or limited, is intended to inherently include disclosure, as embodiments of the invention, of the utilized features and implemented capabilities of such device or system.

Thus, embodiments of the invention can provide improved interfaces between electronics trays that are to be cooled by a liquid flow and manifolds that provide the liquid flow to the electronics trays. In some embodiments, for example, bushings can be captivated between a channel and a manifold tube to provide a face-seal. The bushings can be received at least partially within a spotface cut into a surface of the manifold tube to locate the bushings in the correct positions and can help to ensure appropriate connection of fluid ports on the electronics tray to the fluid ports on the manifold (e.g., for engagement of quick-connect couplings).

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A manifold assembly for a server rack, the manifold assembly comprising:
    a manifold tube with a port hole within a spotface that extends inward from an external surface of the manifold tube;
    a channel having a channel aperture; and
    a bushing with a throughbore extending along a bushing axis;
    the bushing coupled to the channel with the bushing axis in alignment with a center of the channel aperture; and
    the channel rigidly secured to the manifold tube to provide structural support thereto relative to the server rack, with the bushing captivated between the channel and the manifold tube and the bushing received within the spotface.

2. The manifold assembly of claim 1, wherein the bushing has a pilot ridge that defines a shoulder around the pilot ridge;
    the pilot ridge being configured to extend into the channel aperture and the shoulder being configured to contact an internal surface of the channel to locate the bushing within the channel aperture.

3. The manifold assembly of claim 2, wherein the bushing is affixed to the channel.

4. The manifold assembly of claim 1, wherein each of the channel aperture and the bushing includes at least one flat side to provide an indexed fit therebetween.

5. The manifold assembly of claim 1, wherein the bushing is configured to threadably receive a quick-connect coupling.

6. The manifold assembly of claim 5, wherein the quick-connect coupling provides a liquid-tight face seal with a spotface surface of the spotface.

7. The manifold assembly of claim 1, wherein the bushing provides a liquid-tight face seal with a spotface surface of the spotface.

8. The manifold assembly of claim 7, wherein the bushing provides a liquid-tight seal with a quick-connect coupling threadingly received within the throughbore.

9. The manifold assembly of claim 1, wherein the bushing axis is in alignment with a center of the port hole.

10. The manifold assembly of claim 1, wherein the channel is rigidly secured to the manifold tube on opposing sides of the manifold tube adjacent to the port hole.

11. A manifold assembly for a server rack, the manifold assembly comprising:
- a manifold tube with a first manifold wall, a second manifold wall, and a third manifold wall, the first manifold wall having a plurality of port holes for flow of a coolant fluid;
- a channel with a first channel wall, a second channel wall, and a third channel wall, the first channel wall extending between the second and third channel walls and having a plurality of channel apertures; and
- a plurality of bushings, each with a throughbore defining a bushing axis, fixedly coupled to the first channel wall with the bushing axes axially aligned with the respective channel apertures to provide respective flow paths for the coolant into or out of the port holes of the manifold tube;
- the second and third channel walls secured to the second and third manifold walls, respectively, at locations adjacent each of the plurality of port holes to rigidly secure the channel to the manifold tube.

12. The manifold assembly of claim 11, wherein each of the plurality of bushings is positioned along the manifold tube at a respective locating feature on the manifold tube.

13. The manifold assembly of claim 12, wherein the locating feature is a spotface that is recessed from an external surface of the manifold tube and at least a portion of the bushing is received therein.

14. The manifold assembly of claim 13, wherein the bushing is configured to threadably receive a quick-connect coupling so that the quick-connect coupling provides a liquid-tight face seal with a spotface surface of the spotface.

15. The manifold assembly of claim 13, wherein the bushing provides a liquid-tight face seal with a spotface surface of the spotface.

16. The manifold assembly of claim 15, further comprising:
- a respective quick-connect coupling received in the throughbore of each of the plurality of bushings, wherein the quick-connect coupling provides a liquid-tight seal with the bushing.

17. The manifold assembly of claim 11, wherein the channel aperture includes at least one flat side aligned with at least one flat side of the bushing to provide an indexed fit therebetween.

18. A manifold assembly for a server rack, the manifold assembly comprising:
- a manifold tube with a locating feature formed within a wall thereof, the manifold tube extending a manifold length in an elongate direction and including a port hole for coolant flow;
- a rigid channel secured to the manifold tube along the elongate direction to stiffen the manifold tube; and
- a bushing, configured to receive a quick-connect coupling, rigidly secured to the channel and positioned within the locating feature on the wall of the manifold tube to align the bushing with the port hole of the manifold tube.

19. The manifold assembly of claim 18, wherein the bushing makes only superficial contact with the manifold tube.

20. The manifold assembly of claim 18, wherein the channel is secured to the manifold tube on sides of the manifold tube adjacent the locating feature and in locations aligned therewith.

* * * * *